United States Patent [19]
Signell et al.

[11] Patent Number: 5,995,035
[45] Date of Patent: *Nov. 30, 1999

[54] CYCLIC ANALOG-TO-DIGITAL CONVERTER THAT REDUCES THE ACCUMULATION OF OFFSET ERRORS

[75] Inventors: Svante Signell, Vällingby; Bengt Erik Jonsson, Farsta; Helge Stenström, Stockholm; Nianxiong Tan, Sollentuna, all of Sweden

[73] Assignee: Telefonaktiebolaget LM Ericsson, Stockholm, Sweden

[*] Notice: This patent is subject to a terminal disclaimer.

[21] Appl. No.: 08/990,335

[22] Filed: Dec. 15, 1997

[30] Foreign Application Priority Data

Dec. 16, 1996 [SE] Sweden ................... 9604617

[51] Int. Cl.⁶ ........................................ H03M 1/34
[52] U.S. Cl. ........................................ 341/163; 341/155
[58] Field of Search .................... 341/118, 120, 341/155, 163, 158, 159, 161

[56] References Cited

U.S. PATENT DOCUMENTS

| | | | |
|---|---|---|---|
| 3,035,258 | 5/1962 | Chasek | 341/155 |
| 3,187,325 | 6/1965 | Waldhauer | 341/155 |
| 4,119,960 | 10/1978 | Hill | 341/118 |
| 4,599,602 | 7/1986 | Matzuzawa et al. | 341/155 |
| 4,745,394 | 5/1988 | Cornett | 341/118 |

OTHER PUBLICATIONS

Plassche, Rudy J., "A High–Speed 7 Bit A/D Converter", IEEE Journal of Solid State Circuites, vol. SC–14, No. 6, Dec. 1979.

Primary Examiner—Howard L. Williams
Assistant Examiner—Peguy Jean Pierre
Attorney, Agent, or Firm—Burns, Doane, Swecker & Mathis, L.L.P.

[57] ABSTRACT

Cyclic A/D-conversion of an analog input signal is performed according to a new and inventive recursive algorithm which generates a Gray coded digital output signal. In cyclic A/D-conversion, the output bits are generated cyclically, one by one. According to the inventive Gray coding algorithm, the analog input signal is cyclically subjected to a sample and hold operation, selectively, depending on the previously generated output bit, to a signal inversion, to an amplification by two, and to an addition of a predetermined reference signal. In a cyclic A/D-converter architecture based on the recursive Gray coding algorithm according to the invention, the accumulation of offset errors will generally be very low. Furthermore, the fact that the signal inversion is digitally controlled enables high precision implementations which further improve the performance of the cyclic A/D-converter according to the invention.

6 Claims, 11 Drawing Sheets

CYCLIC ANALOG-TO-DIGITAL CONVERTER THAT REDUCES THE ACCUMULATION OF OFFSET ERRORS

TECHNICAL FIELD

The present invention generally relates to analog-to-digital conversion, and more specifically to cyclic analog-to-digital conversion.

BACKGROUND

An analog-to-digital (A/D) converter is a circuit on the borderline between the analog domain and the digital domain which acts as an intermediary in the exchange of information between the two domains. As the name indicates, an A/D-converter converts or transforms analog input signals to digital output signals. An A/D-converter could be used for converting analog information such as audio signals or measurements of physical variables into numbers consisting of two-level digits or bits; a form suitable for digital processing. A/D-converters are found in numerous applications of all modern technologies. They are widely used in different fields of electronics and communication.

The accuracy of an A/D-converter naturally determines to what extent the digital output signal truly represents the analog input signal. The performance evaluation of an A/D-converter with regard to accuracy and distortion is normally based on the magnitude of the error generated in the A/D-conversion. In general, all A/D-converters suffer from offset errors due to imperfections in the circuit realizations of the converters. These offset errors will influence the behavior and performance of the A/D-converter.

A particular type of A/D-converter is the cyclic A/D-converter which utilizes the same functional blocks cyclically for bit-wise generation of all the bits of a digital output value. Conventionally, cyclic A/D-converters are constructed to generate digital output signals of regular binary code. In these conventional binary code cyclic A/D-converters, the offset errors propagate and accumulate in a strictly increasing manner during a conversion, thus limiting the accuracy of the converter and increasing the distortion. Relatively large differential and integral non-linearities will be introduced, and in the worst case scenario some output codes might be missing.

SUMMARY

The present invention reduces these and other drawbacks of the prior art.

It is a general object of the present invention to provide a method for cyclic A/D-conversion which substantially reduces the accumulation of offset errors during a conversion, compared to conventional binary code cyclic A/D-conversion.

It is another object of the invention to provide a cyclic A/D-converter which has high accuracy and low sensitivity to circuit realization imperfections.

These objects are solved by the invention as defined in the accompanying claims.

In accordance with a general inventive concept, cyclic A/D-conversion of an analog input signal is performed according to an inventive recursive algorithm which generates a Gray coded digital output signal. In cyclic A/D-conversion, the output bits are generated cyclically, one by one. According to the inventive Gray coding algorithm, in each bit decision cycle, the digital information obtained from the previous bit decision determines whether or not the cyclic signal is inverted. In a cyclic A/D-converter architecture based on the recursive Gray coding algorithm according to the invention, the accumulation of offset errors will generally be very low.

Furthermore, the fact that the signal inversion is digitally controlled enables high precision implementations which further improve the performance of the inventive cyclic A/D-converter.

The Gray code cyclic A/D-conversion according to the invention offers the following advantages over conventional binary code cyclic A/D-conversion:

higher accuracy and lower distortion reduced accumulation of offset errors;

lower sensitivity to circuit imperfections;

smaller differential and integral non-linearities;

fewer missing codes; and superior dynamic performance, especially for small input signals.

Other advantages offered by the present invention will be appreciated upon reading of the below description of the embodiments of the invention.

BRIEF DESCRIPTION OF THE DRAWINGS

The novel features believed characteristic of the invention are set forth in the appended claims. The invention itself, however, as well as other features and advantages thereof will be best understood by reference to the detailed description of the specific embodiments which follows, when read in conjunction with the accompanying drawings, wherein:

DETAILED DESCRIPTION

In general, a cyclic A/D-converter utilizes the same functional blocks cyclically to generate a digital output value, bit by bit. In such a converter the analog signal circulates in a signal transforming loop from which the signal is recurrently sent to a comparator for bit-wise generation of the digital output bits.

For a better understanding of the invention it is useful to begin by explaining the principle and operation of a conventional cyclic A/D-converter which uses regular binary coding.

Conventional Cyclic A/D-conversion Based on Regular Binary Code

In order to avoid misconceptions, the following definition of regular binary code will be used throughout the disclosure. In regular binary code, numbers are expressed as linear combinations of powers of 2:

$$\text{Number} = \sum_{i=1}^{n} b_i \cdot 2^{n-i},$$

where i and n are integers, and $b_i$ represents a two-level digit (the i-th bit). The integer n indicates the number of bits, and index i indicates the bit position. A coded number is normally represented as a sequence of bits, where the leftmost bit (i=1) of the sequence is the most significant bit (MSB), and the rightmost bit (i=n) is the least significant bit (LSB). Hereinafter, regular binary code will simply be referred to as binary code.

Figure 1:
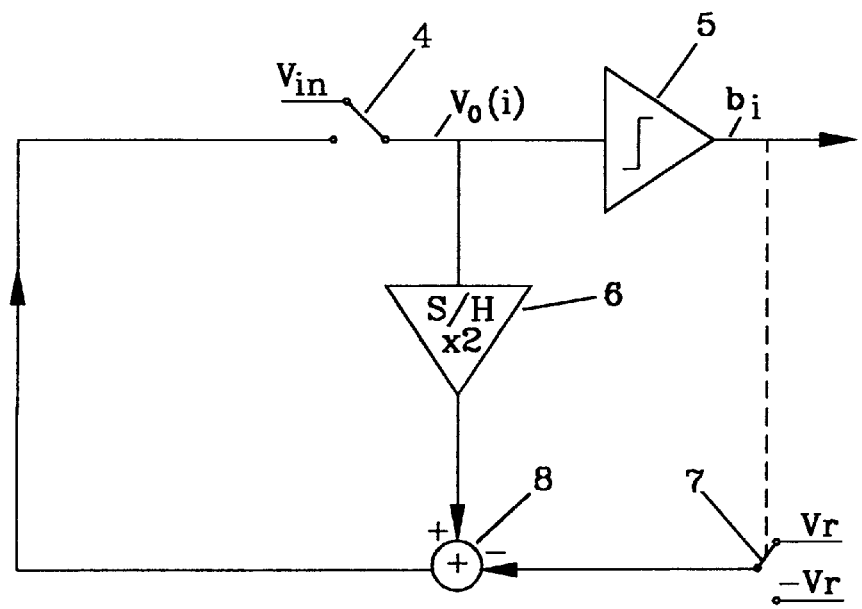
FIG. 1 is a schematic diagram illustrating the basic principle of a conventional binary code cyclic A/D-converter (prior art)

FIG. 1 is a schematic diagram illustrating the basic principle of a conventional cyclic A/D-converter which is based on binary code. The binary code cyclic A/D-converter shown in FIG. 1 comprises the following functional blocks: a first switch 4, a comparator 5, a sample/hold amplifier 6 with a gain factor of 2, a second switch 7 and an adder/subtractor 8. In general, clock signals are utilized to control the operation of the cyclic A/D-converter, i.e. functional blocks thereof. These clock signals are generated by a clock signal generator (not shown).

The A/D-conversion starts by connecting the first switch 4 to an input voltage, hereinafter referred to as the input signal, $V_{in}$ or $V_o(1)$. Accordingly, the input signal $V_{in}$ is connected to the comparator 5 and the sample/hold amplifier 6. In the comparator 5, a first code bit $b_1$, the most significant bit (MSB) of the digital output value, is generated depending on the sign of the input signal. Further, the input signal is sampled and held by the sample/hold amplifier 6 which also amplifies the signal by a factor of 2. The generated code bit, in this case $b_1$, determines whether a reference voltage Vr, hereinafter referred to as the reference signal, is added to or subtracted from the amplified output signal of the sample/hold amplifier 6. The generated bit controls a second switch 7 such that either the reference signal or its inverse will be switched into connection with the adder/subtractor 8 and added to the output signal of the sample/hold amplifier 6. The first switch 4 is then connected to the output of the adder/subtractor 8, thus closing the loop and initiating signal circulation. The next code bit $b_2$, the 2-nd MSB, is determined by comparing the current output signal, in this case $V_o(2)$, of the adder/subtractor 8 with a zero level in the comparator 5. The 2-nd MSB, $b_2$, in turn determines whether the reference voltage Vr or its inverse is added to the current output signal of the sample/hold amplifier 6. The first switch 4 is still connected to the output of the adder/subtractor 8 and the 3-rd MSB, $b_3$, is generated in the comparator 5. The operation continues until the least significant bit (LSB) has been generated, at which time the loop is opened. A new A/D-conversion starts by once again connecting the first switch 4 to an input signal.

Cyclic A/D-converters are also known as algorithmic A/D-converters, and the operation of the conventional binary code cyclic A/D-converter can be summarized by a recursive algorithm which is defined by the following equations:

$$V_o(i)=2\cdot V_o(i-1)+(-1)^{b_{i-1}}\cdot V_r, \ (2\leq i\leq n); \ V_o(i=1)=V_{in} \quad (1.1)$$

and $$b_i = \begin{cases} 1, & \text{if } V_o(i) \geq 0 \\ 2, & \text{if } V_o(i) < 0 \end{cases} \quad (1 \leq i \leq n) \quad (1.2)$$

where $b_i$ denotes the i-th binary output bit, and i is an integer value ranging from 1 to n (n represents the number of bits of the digital output value). Note that $b_1$ is the MSB and $b_n$ is the LSB of the digital output value. In general, $|V_{in}| \leq V_r$.

In order to more easily understand the operation of the conventional binary code cyclic A/D-converter, an illustrative example of an ideal conversion of an analog input signal into a 4-bit digital output value will be described with reference to FIG. 1 and equations (1.1) and (1.2). In this particular example, assume that the reference voltage is equal to 1.0 V and that the input signal corresponds to an input voltage of +0.49 V. It should be understood that $V_o(1)=V_{in}$, and that the cyclic signal $V_o(i)$ will change in each cycle/iteration according to the recursive formula of equation (1.1). The i-th binary output bit $b_i$ is generated according to equation (1.2). The A/D-conversion starts by connecting the first switch 4 to the input signal.

Generating the first binary output bit $b_1$ (MSB), i=1:

$V_o(1)=V_{in}=0.49$, and $b_1=1$.

Generating the second binary output bit $b_2$ (2-nd MSB), i=2:

$V_o(2)=2\cdot 0.49+(-1)^1\cdot 1.0=0.98-1.0=-0.02$, and $b_2=0$.

Generating the third binary output bit $b_3$ (3-rd MSB), i=3:

$V_o(3)=2\cdot(-0.02)+(-1)^0\cdot 1.0=-0.04+1.0=0.96$, and $b_3=1$.

Generating the fourth binary output bit $b_4$ (4-th MSB), i=4:

$V_o(4)=2\cdot 0.96+(-1)^1\cdot 1.0=1.92-1.0=0.92$, and $b_4=1$.

According to the example, the resulting digital output value will have 4 bits, and hence the 4-th MSB is the LSB. By definition, when the LSB has been generated the A/D-conversion is completed. Accordingly, with a reference voltage of 1.0 V corresponding to the binary coded value of 1111, an input voltage of +0.49 V was converted into the binary coded output value 1011.

However, conventional cyclic A/D-converters using binary coding suffer from high sensitivity to offset errors caused by circuit realization imperfections. In practical A/D-converter realizations, offset errors originate from e.g. the DC offset in the circuit and clock feedthrough errors. Of course other types of errors such as low-frequency noise may be produced in the conversion. Anyway, in generating each bit, or more particularly the i-th bit, an error $\Delta V_e(i-1)$ will be generated. The errors generated in a conversion will propagate through and accumulate in the cyclic A/D-converter. Referring to equation (1.1) above with consideration to the error produced in generating each bit, the following equation results:

$$V_o(i)=2\cdot V_o(i-1)+(-1)^{b_{i-1}}\cdot V_r+\Delta V_e(i-1); \ 2\leq i\leq n \quad (1.3)$$

Because of the structure of the conventional binary code cyclic A/D-converter, the errors will accumulate in a strictly increasing manner. This can be seen by iterating equation (1.3) up until i=n, with the following result:

$$V_o(n) = 2^{n-1} \cdot V_{in} + \sum_{j=1}^{n-1} 2^{n-1-j} \cdot (-1)^{b_j} \cdot V_r + \sum_{j=1}^{n-1} 2^{n-1-j} \cdot \Delta V_e(j) \quad (1.4)$$

The total accumulated error for an n-bit cyclic A/D-converter using binary coding, is given by:

$$\varepsilon_{bin} = \sum_{j=1}^{n-1} 2^{n-1-j} \Delta V_e(j) \quad (1.5)$$

where $\Delta V_e(j)$ represents the error voltage produced when generating the (j+1)-th MSB. Since errors due to offset generally have the same sign, these errors are truly accumulated, limiting the accuracy and increasing the distortion of the conventional binary code cyclic A/D-converter.

Cyclic A/D-conversion According to the Invention

The general idea according to the present invention is to perform cyclic A/D-conversion of an analog input signal into a digital output signal according to an inventive recursive Gray coding algorithm. The particular recursive algorithm used by the invention will be described below. Naturally, the generated digital output signal is in the form of Gray code. In a cyclic A/D-converter architecture based on the recursive Gray coding algorithm according to the invention, the accumulation of errors during a cyclic conversion will be substantially reduced, compared to a conventional binary code cyclic A/D-converter.

In general, Gray code is known as a sequence of bit patterns in which adjacent patterns differ in only a single bit. The Gray code structure is most easily understood by studying table I given below. Table I illustrates 4-bit Gray code to the left, 4-bit binary code in the middle, and corresponding decimal numbers to the right.

TABLE I

| Gray | Binary | Decimal |
|------|--------|---------|
| 0000 | 0000 | 0 |
| 0001 | 0001 | 1 |
| 0011 | 0010 | 2 |
| 0010 | 0011 | 3 |
| 0110 | 0100 | 4 |
| 0111 | 0101 | 5 |
| 0101 | 0110 | 6 |
| 0100 | 0111 | 7 |
| 1100 | 1000 | 8 |
| 1101 | 1001 | 9 |
| 1111 | 1010 | 10 |
| 1110 | 1011 | 11 |
| 1010 | 1100 | 12 |
| 1011 | 1101 | 13 |
| 1001 | 1110 | 14 |
| 1000 | 1111 | 15 |

In both types of code, Gray code and binary code, the rightmost bit is the least significant bit (LSB). It should however be realized that in Gray code, no specific bit weights can be assigned to the bits of the coded values. Gray code is sometimes described as a reflection code, because all the positions of a Gray code value except for the leftmost bit position (MSB) appear as a reflection around a reflection line, whereas the leftmost position changes logical state.

Because of the single bit change between adjacent bit patterns, Gray coding is often used for representing quantized signal levels and in phase shift keying.

Gray coding has also been used in connection with A/D-converters in the prior art:

According to the article "A High-Speed 7 Bit A/D Converter" in IEEE Journal of Solid-State Circuits, Vol. SC-14, No. 6, December 1979, by R. J. van de Plassche and R. E. J. van der Grift, Gray coding is used in folding-type A/D-converters. A folding-type A/D-converter comprises a plurality of parallel stages, and converts all bits in parallel, as opposed to a cyclic A/D-converter which uses a single stage to cyclically generate the output codes bit by bit. Since a folding-type converter determines all bits in parallel, there is no error accumulation as in cyclic converters. Instead Gray coding is used for reducing the number of comparators in the circuit realization.

U.S. Pat. No. 3,187,325 issued to F. D. Waldhauer on Jun. 1, 1965, discloses a stage-by-stage encoder comprising a multiplicity of similar stages connected in cascade. The stage-by-stage encoder of Waldhauer generates Gray code words by using an all-analog folding technique.

U.S. Pat. No. 3,035,258 issued to N. E. Chasek on May 15, 1962, discloses a pulse code modulation encoder generating Gray code words by means of an all-analog folding technique. The PCM-encoder has a plurality of cascaded encoder circuits. Each encoder circuit comprises a full wave rectifier, a sensing circuit for determining the instantaneous polarity of the signal and a sampling network for sampling the signal polarity at a suitable rate.

Figure 2:
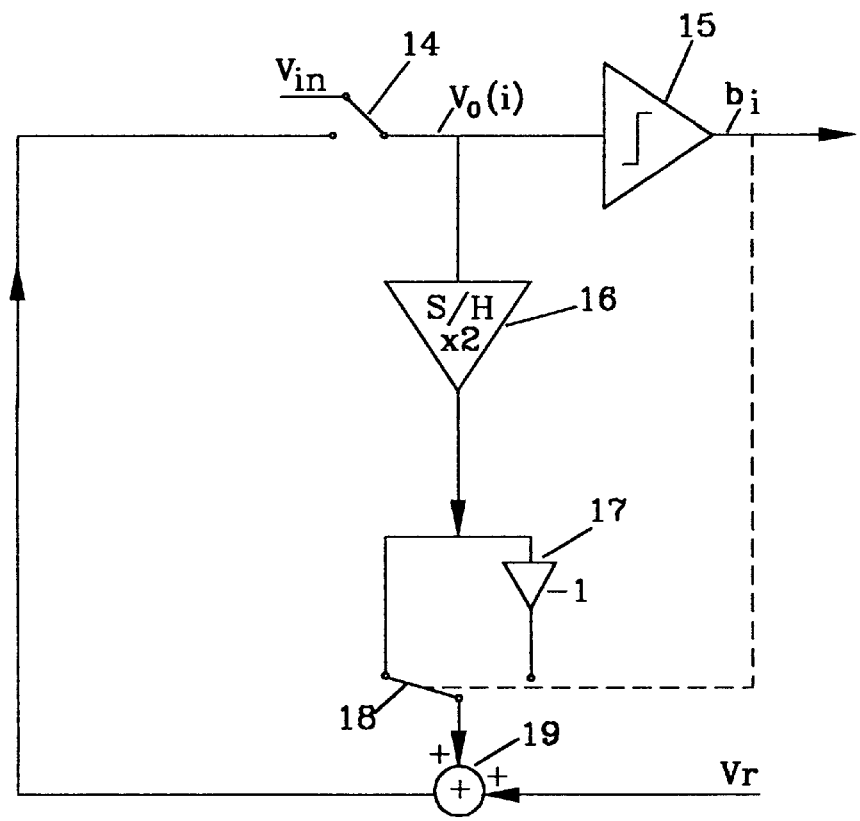
FIG. 2 is a schematic diagram illustrating the principle of a cyclic A/D-converter according to the invention.

Now, the basic principle of the present invention will be explained with reference to FIG. 2 which schematically illustrates an example of a cyclic A/D-converter according to the invention. The cyclic A/D-converter comprises the following functional blocks: a first switch 14, a comparator 15, a sample/hold amplifier 16, signal inverting means 17, a second switch 18 and an adder 19. The operation of the cyclic A/D-converter according to the invention is preferably controlled by appropriate clock signals. The clock signals are generated by a clock signal generator (not shown). For reasons of simplicity and clarity, the clock signals are not shown in the schematic diagram of FIG. 2.

The cyclic A/D-conversion according to the invention starts by connecting the first switch 14 to the input voltage, hereinafter referred to as the input signal, $V_{in}$ or $V_o(1)$. Accordingly, the input signal $V_{in}$ is connected to the comparator 15 and the sample/hold amplifier 16. In the comparator 15, a first output bit $b_1$ (MSB), in the form of Gray code, of the digital output signal, is generated depending on the sign of the input signal. The input signal $V_{in}$ is sampled and held by the sample/hold amplifier 16 which also amplifies the signal by a factor of 2. The generated Gray code bit, in this case $b_1$, determines whether the output signal of the sample/hold amplifier 16 or its inverse is added to a reference voltage Vr, hereinafter referred to as the reference signal. The signal inversion is carried out by the signal inverting means 17. The second switch 18, which is controlled by the generated Gray code bit, determines if the output signal of the amplifier 16 or its inverse is connected to the adder 19. The adding is executed in the adder 19. The first switch 14 is then connected to the output of the adder 19, thus closing the signal loop and initiating signal circulation. The next Gray code bit $b_2$, the 2-nd MSB, is determined by comparing the current output signal of the adder 19, in this case $V_o(2)$, with a zero level in the comparator 15. The 2-nd MSB, $b_2$, in turn determines whether the current output signal of the sample/hold amplifier 16 or its inverse is added to the reference signal Vr. The first switch 14 is still connected to the output of the adder 19 and the 3-rd MSB, $b_3$, is generated. The operation continues until the least significant bit (LSB) have been generated, at which time the loop is opened. A new A/D-conversion starts by once again connecting the first switch 14 to the input signal.

The operation of the cyclic A/D-converter according to the invention can be summarized by a recursive Gray coding algorithm which is defined by the following equations:

$$V_o(i=1)=V_{in};$$

$$V_o(i)=2\cdot(-1)^{b_{i-1}}\cdot V_o(i-1)+V_r, \quad (2\leq i\leq n) \tag{2.1}$$

and $$b_i = \begin{cases} 1, & \text{if } V_o(i) \geq 0 \\ 0, & \text{if } V_o(i) < 0 \end{cases} \quad (1 \leq i \leq n) \tag{2.2}$$

where i is an integer value ranging from 1 to n (n represents the number of bits of the digital output), and $b_i$ denotes the i-th Gray code bit (i-th MSB). $V_r$ denotes a predetermined reference signal. In general, $|V_{in}| \leq V_r$.

In fact, equations (2.1) and (2.2) give a precise definition of a preferred embodiment of the present invention.

By studying the algorithm according to the invention, as defined above in equations (2.1) and (2.2), it can be seen that the digital information $b_{i-1}$, obtained from the previous bit decision is utilized in generating the current output bit $b_i$. Accordingly, a decision feed-forward function is inherent in the algorithm. In practical implementations of the Gray coding algorithm according to the invention, this feed-forward of earlier bit decisions normally requires some sort of sample-and-hold functionality. It is the hold function of the sample-and-hold circuitry that enables the feed-forward of the previously generated digital information. This will be explained in more detail later, in connection with a fully differential realization of the invention.

For a better understanding of the operation of the Gray code cyclic A/D-converter according to the invention, an illustrative example of an ideal Gray code conversion of an analog input signal into a 4-bit digital output will now be described with reference to equations (2.1) and (2.2). In order to be able to compare conventional binary code conversion and the Gray code conversion according to the invention, consider the same reference voltage, 1.0 V, and the same input voltage, +0.49 V, as in the example with the ideal binary code cyclic A/D-converter above. It should be understood that $V_o(1)=V_{in}$, and that the circulating signal $V_o(i)$ will change in each circulation/iteration according to the recursive formula of equation (2.1). The i-th MSB, the Gray code bit $b_i$, is generated according to equation (2.2).
Generating the first Gray code bit $b_1$ (MSB), i=1:
 $V_o(1)=V_{in}=0.49$, and
 $b_1=1$.
Generating the second Gray code bit $b_2$ (2-nd MSB), i=2:
 $V_o(2)=2\cdot(-1)^1\cdot 0.49+1.0=-0.98+1.0=0.02$, and
 $b_2=1$.
Generating the third Gray code bit $b_3$ (3-rd MSB), i=3:
 $V_o(3)=2\cdot(-1)^1\cdot 0.02+1.0=-0.04+1.0=0.96$, and
 $b_3=1$.
Generating the fourth Gray code bit $b_4$ (4-th MSB), i=4:
 $V_o(4)=2\cdot(-1)^1\cdot 0.96+1.0=-1.92+1.0=-0.92$, and
 $b_4=0$.

Since the resulting digital output value should have 4 bits in this particular example, the 4-th MSB is the LSB, and when the LSB has been generated the A/D-conversion is completed. Accordingly, with a reference voltage of 1.0 V corresponding to the Gray code value of 1000, an input voltage of +0.49 V was converted into the Gray code output value 1110. By using Table I above, it can be seen that the Gray code value 1110 corresponds to the binary code value 1011, which is the same binary code value as that generated in the example of a conventional binary code cyclic A/D-conversion of a +0.49 V input voltage above. Consequently, the resulting digital output value of the Gray code converter according to the invention and the resulting digital output value of the conventional binary code converter are consistent with each other, although they are generated in different types of code.

However, the propagation of offset errors in the tray code cyclic A/D-conversion according to the invention differs completely from that in conventional binary code cyclic A/D-conversion. In generating each bit, or more specifically the i-th bit, in a Gray code cyclic A/D-converter according to the invention, an error $\Delta V_e(i-1)$ including e.g. DC-offset and clock feedthrough error will normally be generated. However, in the cyclic A/D-converter based on the Gray coding algorithm according to the invention, these errors will not necessarily accumulate in an increasing manner. Referring to equation (2.1) above with consideration to the error $\Delta V_e(i-1)$ produced in generating the i-th output bit, the following equation results:

$$V_o(i)=2\cdot(-1)^{b_{i-1}}\cdot V_o(i-1)+V_r+\Delta V_e(i-1) \tag{2.3}$$

By iterating equation (2.3) up until i=n, the result will be:

$$V_o(n) = \tag{2.4}$$

$$2^{n-1}\cdot(-1)^{\sum_{j=1}^{n-1}b_j}\cdot V_{in} + \left\{\sum_{j=1}^{n-2}\left(2^{n-1-j}\cdot(-1)^{\sum_{k=j+1}^{n-1}b_k}\right)+1\right\}\cdot V_r +$$

$$\sum_{j=1}^{n-2}\left(2^{n-1-j}\cdot(-1)^{\sum_{k=j+1}^{n-1}b_k}\cdot \Delta V_e(j)\right)+\Delta V_e(n-1)$$

Therefore, the total accumulated error for an n-bit cyclic A/D-converter that is based on the Gray coding algorithm according to the invention, is given by:

$$\varepsilon_{Gray} = \sum_{j=1}^{n-2}\left(2^{n-1-j}\cdot(-1)^{\sum_{k=j+1}^{n-1}b_k}\cdot \Delta V_e(j)\right)+\Delta V_e(n-1) \tag{2.5}$$

where $\Delta V_e(j)$ represents the error voltage produced when generating the (j+1)-th MSB. A more thorough derivation of the total accumulated error for an n-bit Gray code cyclic A/D-converter according to the invention will be given below in connection with a fully differential realization of the invention.

Now, compare the total accumulated error for the binary code cyclic A/D-converter and the inventive Gray code cyclic A/D-converter by studying equation (1.5) and equation (2.5).

Since $$(-1)^{\sum_{k=j+1}^{n-1}b_k} = \pm 1, \tag{3.1}$$

the following relation holds true:

$$2^{n-1-j} \cdot (-1)^{\sum_{k=j+1}^{n-1} b_k} \leq 2^{n-1-j}. \quad (3.2)$$

Furthermore, because $\Delta V_e(j)$ generally have the same sign independent of j, the following relation results:

$$|\varepsilon_{Gray}| = \left| \sum_{j=1}^{n-2} \left( 2^{n-1-j} \cdot (-1)^{\sum_{k=j+1}^{n-1} b_k} \cdot \Delta V_e(j) \right) + \Delta V_e(n-1) \right| \leq \quad (3.3)$$

$$\left| \sum_{j=1}^{n-2} 2^{n-1-j} \Delta V_e(j) + \Delta V_e(n-1) \right| = \left| \sum_{j=1}^{n-2} 2^{n-1-j} \Delta V_e(j) \right| = |\varepsilon_{bin}|$$

Strictly mathematically speaking, equation (3.3) shows that the total accumulated error in an n-bit Gray code cyclic A/D-conversion according to the invention is smaller than or equal to the total accumulated error in an n-bit binary code cyclic A/D-conversion. In practice, however, the Gray code accumulated error will almost always be smaller than the binary code accumulated error. It is useful to give a brief and intuitive explanation of this fact. As is well known, the error $\Delta V_e(j)$ will propagate through the loop of the A/D-converter. However, in the cyclic A/D-converter based on the recursive Gray coding algorithm according to the invention, the cyclic signal is selectively subjected to an inversion, depending on the most recently generated Gray code output bit. Since the generated Gray code output bits vary between the discrete states 0 and 1 more or less randomly, depending on the particular application, the error associated with a generated output bit will sometimes be added to and sometimes subtracted from the total error accumulated up until that point. Consequently, the offset errors generated during an A/D-conversion will not necessarily accumulate in an increasing manner, and the total accumulated error will lie substantially closer to zero in a Gray code conversion based on the algorithm according to the invention than in a conventional binary code conversion.

Accordingly, with regard to the sensitivity to circuit imperfections, the cyclic A/D-converter based on the Gray coding algorithm according to the invention has a significant advantage over its binary code counterpart.

For illustrative purposes, the error accumulation for an exemplary resulting 4-bit binary code value, 0110, generated conventionally, and the error accumulation for the corresponding resulting 4-bit Gray code value 0101, generated in accordance with the invention, will be compared in the following. Since a 4-bit value is considered in this particular example, n is equal to 4. The offset error in generating each bit is assumed to be +0.02 V.

Binary Code Accumulated Error:

According to equation (1.5) for a binary code cyclic A/D-converter, the total accumulated error in generating the binary code value 0110 will be:

$$\varepsilon_{bin}(n=4) = 2^2 \cdot 0.02 + 2^1 \cdot 0.02 + 2^0 \cdot 0.02 = 0.08 + 0.04 + 0.02 = 0.14.$$

Gray Code Accumulated Error:

According to equation (2.5) for a Gray code cyclic A/D-converter according to the invention, the total accumulated error in generating the Gray code value 0101 ($b_1=0$, $b_2=1$, $b_3=0$, $b_4=1$) will be:

$$\varepsilon_{Gray}(n=4) = 2^2 \cdot (-1)^{(1+0)} \cdot 0.02 + 2^1 \cdot (-1)^{(0)} \cdot 0.02 + 0.02 = 4 \cdot (-1) \cdot 0.02 + 2 \cdot (1) \cdot 0.02 + 0.02 = -0.08 + 0.04 + 0.02 = -0.02.$$

It can be seen that $|\varepsilon_{Gray}| < |\varepsilon_{bin}|$. The Gray code error accumulation according to the invention is generally considerably lower than the binary code error accumulation, because the sign associated with the errors are positive as well as negative. This is a property directly related to the term $(-1)^{b_{i-1}}$ of the inventive Gray coding algorithm defined above in equations (2.1) and (2.2). In a statistical sense, the accumulated error in a cyclic A/D-conversion according to the invention is reduced in the majority of cases.

Figure 3:
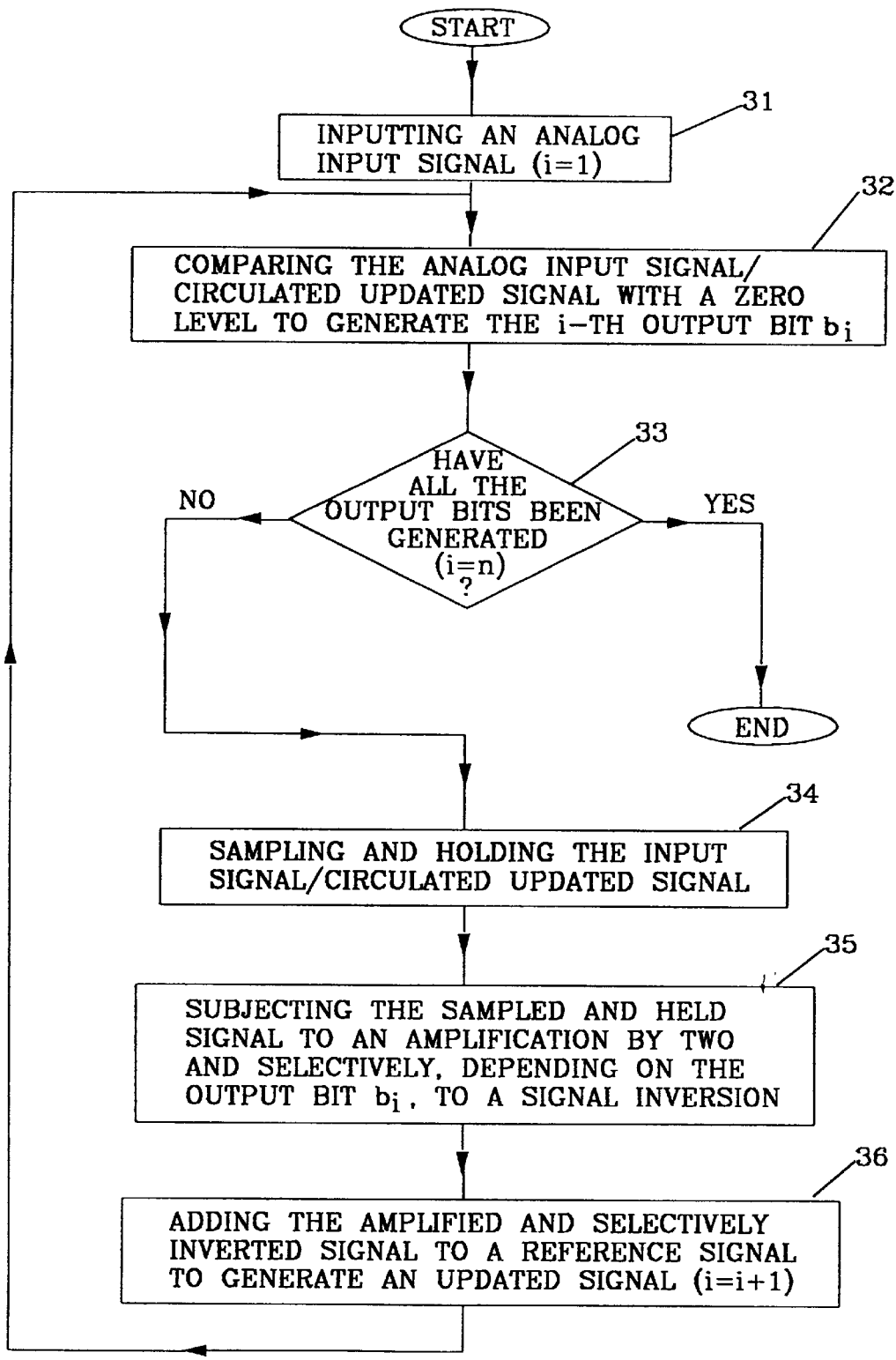
FIG. 3 is a schematic flow diagram of a method for cyclically converting an analog input signal into a digital output signal in accordance with a preferred embodiment of the invention.

FIG. 3 is a schematic flow diagram of a method for cyclically converting an analog input signal into a digital output signal according to a preferred embodiment of the invention. It is assumed that the resulting digital output signal has a predetermined number, n, of output bits $b_i$, where i is an integer ranging from 1 to n. The cyclic A/D-conversion based on the Gray coding algorithm according to the invention basically works as follows. In step 31, the analog input signal $V_o(i=1) = V_{in}$ is inputted for A/D-conversion. At this point i is equal to 1, indicating that the first output bit is to be generated. Next, in step 32, the analog input signal $V_o(i=1)$ is compared with a zero level to generate the first digital Gray code output bit $b_1$ in accordance with equation (2.2). If i is equal to n, i.e. if all the bits of the digital output signal have been generated (YES) at this point, step 33, the A/D-conversion is completed and the procedure ends. However, the digital output signal generally comprises more than a single bit (NO), and the procedure continues with step 34. In step 34, the input signal is sampled and held. Next, in step 35, the sampled and held signal is subjected to an amplification by two and selectively, depending on the Gray code output bit $b_1$ previously generated in step 32, to a signal inversion. The amplified and selectively inverted signal is added to a predetermined reference signal in step 36, to generate an updated analog signal $V_o(i=2)$. At this point i=i+1=2, indicating that the next output bit $b_2$ is to be generated. The updated analog signal is circulated, and the procedure continues with step 32. Now, in step 32, the circulated or cyclic updated analog signal $V_o(2)$ is compared to a zero level to generate the second Gray code output bit $b_2$. The procedure continues in accordance with the flow diagram shown in FIG. 3 until all n output bits have been generated.

A new A/D-conversion is initiated by once again inputting an analog input signal in step 31.

It should be understood that the specific order of the amplification by two, and the selective signal inversion in step 35 generally is not critical for the cyclic A/D-conversion according to the invention. It is possible to selectively, in dependence on the generated output bit $b_i$, invert the sampled and held signal before amplifying it by two. This also holds true for the Gray code cyclic A/D-converter shown in FIG. 2.

Figure 4:
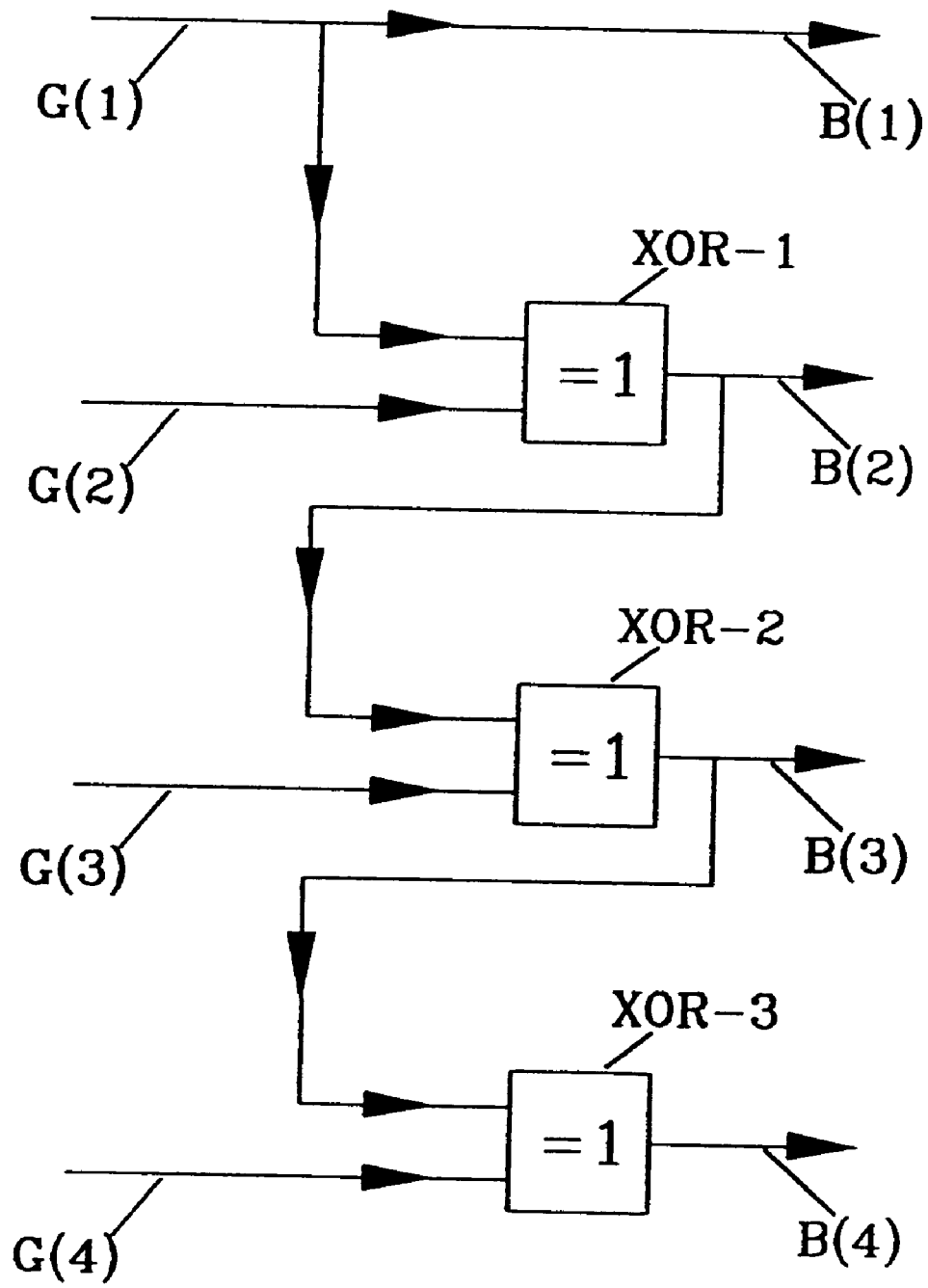
FIG. 4 is a schematic diagram illustrating the transformation of Gray coded bits into bits of binary code.

Naturally, the digital output signal of the Gray code cyclic A/D-converter according to the invention is in the form of Gray code. However, if the cyclic A/D-converter according to the invention is to be used in a system having equipment designed to work with regular binary code, it may be more feasible to convert the Gray code output signal into an output signal of regular binary code. Consequently, in this case, the inventive cyclic A/D-converter generating Gray coded signals further incorporates, as a final stage, means for digitally transforming or converting the Gray coded output signal into an output signal of regular binary code. FIG. 4 is a schematic diagram illustrating an illustrative transformation of 4 bits of Gray code into 4 bits of regular binary code by using simple digital gates XOR-1, XOR-2, XOR-3. The Gray code bits, here denoted G(i), are transformed into bits, here denoted B(i), of regular binary code according to the following known relations:

$$B(1)=G(1);$$

$$B(i)=G(i)\oplus B(i-1), 2\leq i\leq n \qquad (4.1)$$

where n is the number of bits of the code values. In the example of FIG. 4, n is equal to 4. The Gray code MSB, G(1), transforms into the binary code MSB, B(1) without any change. The remaining Gray code bits are transformed into binary code bits by using the corresponding digital XOR-gates. This digital transformation does not introduce any offset errors. Accordingly, by using the inventive Gray code cyclic A/D-conversion in combination with the above digital Gray code-to-binary code transformation, it is possible to perform a cyclic A/D-conversion, of which the final output signal is in the form of regular binary code, and still maintain low accumulation of offset errors.

Figure 5:
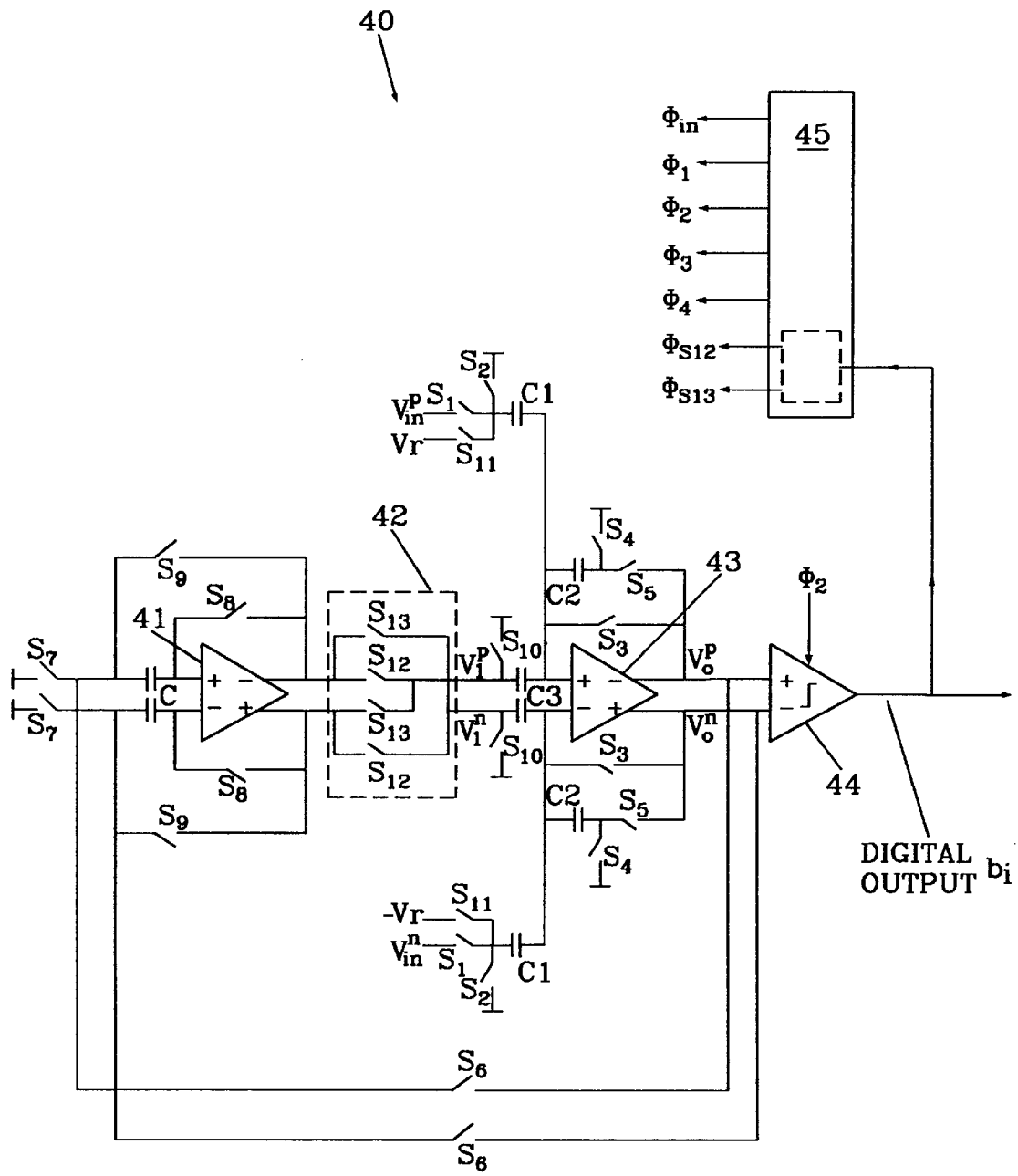
FIG. 5 is a circuit diagram of a fully differential realization of a cyclic A/D-converter in accordance with a currently most preferred embodiment of the invention.

FIG. 5 is a circuit diagram of an exemplary fully differential switched-capacitor realization of a cyclic A/D-converter in accordance with a currently most preferred embodiment of the invention. When dealing with differential A/D-converter realizations, a differential input signal having a positive part $V_{in}^p$ and a negative part $V_{in}^n$ is considered. They have the same magnitude but opposite polarity. In the same way, a predetermined differential reference signal, Vr and -Vr, is utilized by the A/D-converter. The circuit implementation of FIG. 5 realizes the Gray coding algorithm according to the invention With respect to differential signals. The cyclic A/D-converter 40 basically comprises a first operational amplifier (OPAMP) 41, a switch arrangement 42, a second operational amplifier (OPAMP) 43, a comparator 44, a clock signal generator 45, capacitors C, C1, C2 and C3, and switches $S_1$ to $S_{13}$.

Each one of the OPAMPs 41, 43 has two input terminals and two output terminals, and operates with an internal common mode feedback function. The first OPAMP 41 has an associated front capacitor C connected to each of its input terminals. The second OPAMP 43 has two associated front capacitors C3, and two associated parallel capacitors C2. There is a front capacitor C3 connected to each one of the input terminals, and a parallel capacitor C2 selectively connected, via switch $S_5$, in parallel over each pair of input-output terminals. The capacitors C3 have a capacitance of 2 C, and the capacitors C2 have a capacitance equal to C. Thus, in operation, when the second OPAMP 43 is in the amplify phase it will have a gain factor equal to 2. It should be understood that it is the second OPAMP 43 together with its associated capacitors that give the arrangement the gain factor of 2. The first OPAMP 41 and the second OPAMP 43 has switches $S_8$ and $S_3$, respectively, connected in parallel over the corresponding OPAMP. When closed, switches $S_8$ and $S_3$ short-circuit or reset the first OPAMP 41 and the second OPAMP 43, respectively. Switches $S_9$ are connected in parallel over the first OPAMP 41 and its associated front capacitors C. On each side of the second OPAMP 43, there is an input capacitor C1 which is connected to the second OPAMP 43 to contribute, when being discharged, to the voltage over the capacitor C2 thereof. Each one of the input capacitors C1 is connected to three switches $S_1$, $S_2$ and $S_{11}$. The capacitors C1 and the switches $S_1$, $S_2$ and $S_{11}$ constitute switch-capacitor units. Switch $S_1$ selectively connects a respective part of the differential input signal to the input capacitor C1. Switch $S_{11}$ selectively connects a respective part of the differential reference signal, preferably supplied from a conventional signal source, to the input capacitor C1. Switch $S_2$ selectively connects the input capacitor C1 to ground. The capacitors C, C2 and C3 are selectively connected to ground by switches $S_7$, $S_4$ and $S_{10}$, respectively. The switch arrangement 42 has two input terminals and two output terminals and comprises four switches $S_{12}$, $S_{13}$. The comparator 44 has two input terminals and an output terminal. Preferably, the comparator 44 is a latched comparator, the output signal of which is held for an appropriate part of the conversion cycle.

The output terminals of the first OPAMP 41 are connected to the input terminals of the switch arrangement 42. The output terminals of the switch arrangement 42 are connected to the associated capacitors C3 of the second OPAMP 43. The output terminals of the second OPAMP 43 are connected to the input terminals of the comparator 44. The output terminals of the second OPAMP 43 are also connected to the front capacitors C of the first OPAMP 41, via switches $S_6$.

The clock signal generator 45 generates a first set of clock signals, $\Phi_{in}$, $\Phi_1$, $\Phi_2$, $\Phi_3$ and $\Phi_4$, of predetermined timing and predetermined signal values, and a second set of clock signals $\Phi_{S12}$ and $\Phi_{S13}$, with signal values that depend on the generated output bits $b_i$. The output terminal of the comparator 44 is connected to the clock signal generator 45 for providing the generated output bit thereto. The clock signals $\Phi_{S12}$ and $\Phi_{S13}$ are generated according to the following relations:

$$\Phi_{S12}=\Phi_{S13}=0, \text{ when the MSB is being generated } (i=1)$$

$$\Phi_{S12}=\Phi_1\cdot\overline{b}_{i-1}, \text{ for } i\geq 2$$

$$\Phi_{S13}=\Phi_1\cdot\overline{b}_{i-1}, \text{for } i\geq 2 \qquad (5.1)$$

where $\overline{b}_{i-1}$ represents the opposite logical state of $b_{i-1}$.

Figure 6:
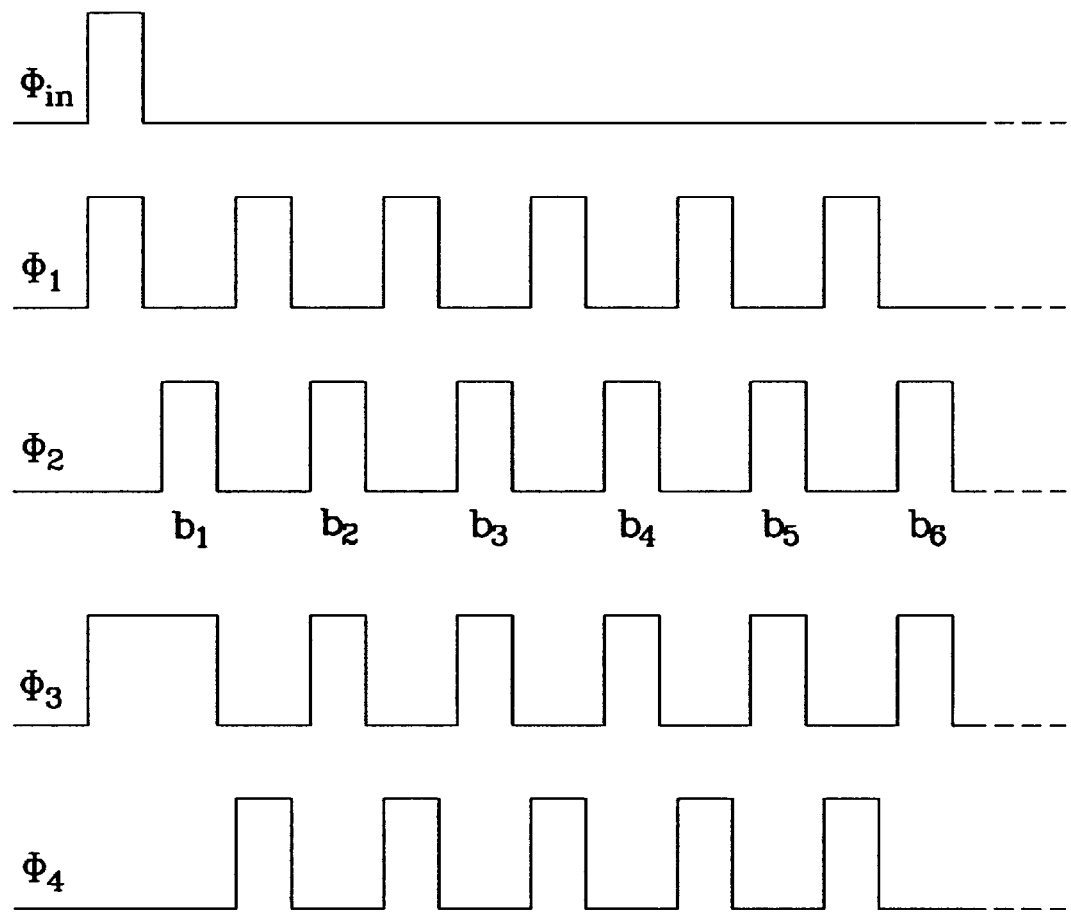
FIG. 6 is a timing diagram illustrating clock pulses that are utilized in the differential implementation of FIG. 5.

FIG. 6 is an example of a timing diagram illustrating the predetermined timing of the clock signals $\Phi_{in}$, $\Phi_1$, $\Phi_2$, $\Phi_3$ and $\Phi_4$ utilized in the fully differential realization of FIG. 5. The operation of the cyclic A/D-converter 40 is controlled by these clock signals, and the clock signals $\Phi_{S12}$ and $\Phi_{S13}$ defined above. More specifically, $\Phi_{in}$ controls switches $S_1$ and $S_7$; $\Phi_1$ controls switches $S_3$ and $S_4$; $\Phi_2$ controls switches $S_2$, $S_5$ and $S_6$; $\Phi_3$ controls switches $S_8$ and $S_{10}$; $\Phi_4$ controls switches $S_9$ and $S_{11}$; $\Phi_{S12}$ controls switches $S_{12}$; and $\Phi_{S13}$ controls switches $S_{13}$. Furthermore, $\Phi_2$ triggers the latched comparator 44. In this realization example, a switch is turned on when the corresponding clock signal goes high, and turned off when the corresponding clock signal goes low. The clock signals are also described in Table II.

In short, without going into details at this stage, the operation of the cyclic A/D-converter 40 will be explained in the following with reference to FIGS. 5 and 6. In the first clock phase, when $\Phi_{in}$, $\Phi_1$ and $\Phi_3$ are high, the circuit is initialized and the differential input signal is sampled by the input capacitors C1. In the next clock phase, when $\Phi_2$ and $\Phi_3$ are high, the sampled input signal is forwarded through the capacitors C2 of the second OPAMP 43 to the comparator 44 in which the first output bit $b_1$ (MSB) is generated. In addition, the input signal is forwarded to and sampled by the capacitors C of the first OPAMP 41. During the subsequent clock phase, when $\Phi_1$ and $\Phi_4$ are high, the output of the first OPAMP 41 is passed to the switch arrangement 42 and selectively inverted thereby in dependence on the generated output bit $b_1$ ($\Phi_{S12}$ and $\Phi_{S13}$ depends on $b_1$ as explained above). The selectively inverted output of the switch arrangement 42 is transferred to and sampled by the associated front capacitors C3 of the second OPAMP 43. Furthermore, the differential reference signal is sampled by the input capacitors C1. In the following clock phase, when $\Phi_2$ and $\Phi_3$ are high, the second OPAMP 43 is in the amplify phase and the selectively inverted signal is amplified by two. The reference signal previously sampled by the input capacitors C1 is transferred to the associated capacitors C2 of the second OPAMP 43 such that the voltage of the reference signal will contribute to the output of the second OPAMP 43. The output of the second OPAMP 43 is quantized in the comparator 44, thus generating the second output bit $b_2$ (2-nd MSB). In addition, the output of the second OPAMP 43 is sampled by the front capacitors C of the first OPAMP 41. The operation of the cyclic A/D-converter 40 continues, in the next clock phase, with the selective inversion in dependence on the generated output bit $b_2$, the sampling of the selectively inverted signal, and the sampling of the reference signal. In the following, the cyclic A/D-conversion will alternate between the operations of clock phases in which $\Phi_2$ and $\Phi_3$ are high, and the operations of the clock phases in which $\Phi_1$ and $\Phi_4$ are high, until all output bits $b_i$ have been generated.

The first OPAMP 41 with its associated front capacitors C acts as a unity gain memory buffer of sample-and-hold type. In the clock phase when $\Phi_2$ and $\Phi_3$ are high, the output of the second OPAMP 43 is quantized in the comparator 44, thus generating a digital output bit. In addition, in the same clock phase, the output of the second OPAMP 43 is sampled by the associated front capacitors C of the first OPAMP 41, i.e. the unity gain memory buffer. Because of the hold operation of the unity gain buffer, and the non-overlapping timing of the clock signals that control the comparator 44 and the switch arrangement 42, respectively, the bit decision of the comparator 44 and the selective inversion of the switch arrangement 42 are separated in time. This separation in time enables the feed-forward of the generated digital output to the switch arrangement 42 which, in the subsequent clock phase when $\Phi_1$ and $\Phi_4$ are high, selectively inverts the signal held by the first memory buffer in dependence on the forwarded output bit.

It should be understood that the signal inversion executed in the switch arrangement 42 utilizes the digital information from the previous bit decision in the comparator 44, and decides whether or not the input to the switch arrangement 42 should be inverted based on this information. The signal inversion is preferably implemented as a digitally controlled polarity shift. In the fully differential realization of FIG. 5 the inversion is performed by interchanging the polarity of the differential signal by using the digitally controlled switch arrangement 42. In this way, the signal inversion is realized with very high accuracy. The high precision of the signal inversion further improves the accuracy of the cyclic A/D-converter according to the invention.

In addition, in the fully differential realization of the Gray code cyclic A/D-converter shown in FIG. 5, there will be essentially no hardware overhead in comparison to the conventional binary code counterpart, since the signal inversion only requires very simple clock controlled switches.

For a better understanding of the fully differential realization of the cyclic A/D-converter 40 shown in FIG. 5, the operation will now be explained in more detail at a number of consecutive clock phases.

Table II below summarizes the states (on/off) of the switches $S_1$ to $S_{13}$ at consecutive clock phases, expressed in terms of high phases of the clock signals $\Phi_1$ and $\Phi_2$. A switch that is turned on is represented by a "1", and a switch that is turned off is represented by a "0". The switches $S_{12}$ and $S_{13}$ depend on the previously generated digital output. By way of example, in generating the MSB, when $\Phi_2$ is high, it can be seen from table II that switch $S_1$ is turned off.

TABLE II

| MSB, $b_i$ | | i-th MSB, $b_i$ (i > 1) | | i-th MSB, $b_i$ (i > 1) | |
|---|---|---|---|---|---|
| High | | when $b_{i-1}$ = 0 | | when $b_{i-1}$ = 1 | |
| High $\Phi_1$ | $\Phi_2$ | High $\Phi_1$ | High $\Phi_2$ | High $\Phi_1$ | High $\Phi_2$ |
| $S_1$ | 1 | 0 | 0 | 0 | 0 | 0 |
| $S_2$ | 0 | 1 | 0 | 1 | 0 | 1 |
| $S_3$ | 1 | 0 | 1 | 0 | 1 | 0 |
| $S_4$ | 1 | 0 | 1 | 0 | 1 | 0 |
| $S_5$ | 0 | 1 | 0 | 1 | 0 | 1 |
| $S_6$ | 0 | 1 | 0 | 1 | 0 | 1 |
| $S_7$ | 1 | 0 | 0 | 0 | 0 | 0 |
| $S_8$ | 1 | 1 | 0 | 1 | 0 | 1 |
| $S_9$ | 0 | 0 | 1 | 0 | 1 | 0 |
| $S_{10}$ | 1 | 1 | 0 | 1 | 0 | 1 |
| $S_{11}$ | 0 | 0 | 1 | 0 | 1 | 0 |
| $S_{12}$ | 0 | 0 | 1 | 0 | 0 | 0 |
| $S_{13}$ | 0 | 0 | 0 | 0 | 1 | 0 |

FIGS. 7A–D are circuit diagrams of the fully differential realization of the cyclic A/D-converter 40 at consecutive clock phases. The circuit diagrams have been reduced to illustrate only those parts of the cyclic A/D-converter 40 that are pertinent at the considered clock phase. Open switches and unconnected elements will generally not be illustrated.

Figure 7A:
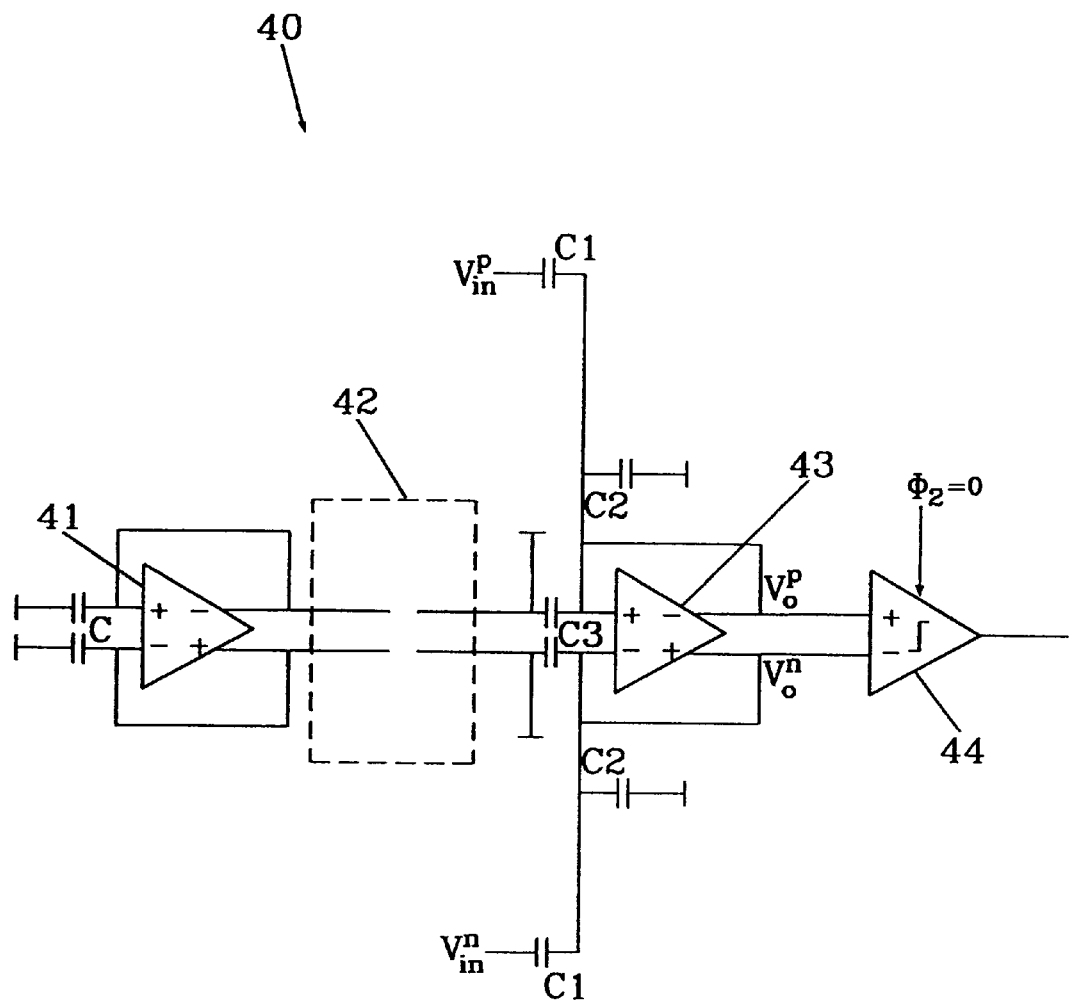
FIG. 7A–D are circuit diagrams of the fully differential implementation of FIG. 5 at different clock phases.

FIG. 7A illustrates the cyclic A/D-converter 40 at the first clock phase $\Phi_1$ for the MSB. According to table II, the switches $S_1$, $S_3$, $S_4$, $S_7$, $S_8$ and $S_{10}$ are turned on. The differential input signal ($V_{in}^p$, $V_{in}^n$) is sampled by the input capacitors C1. The capacitors C, C2 and C3 are all connected to ground, and the first OPAMP 41 and the second OPAMP 43 are reset to enable suppression of the DC-offset in the OPAMPs. The switch arrangement 42 is open. The circuit is initialized.

Figure 7B:
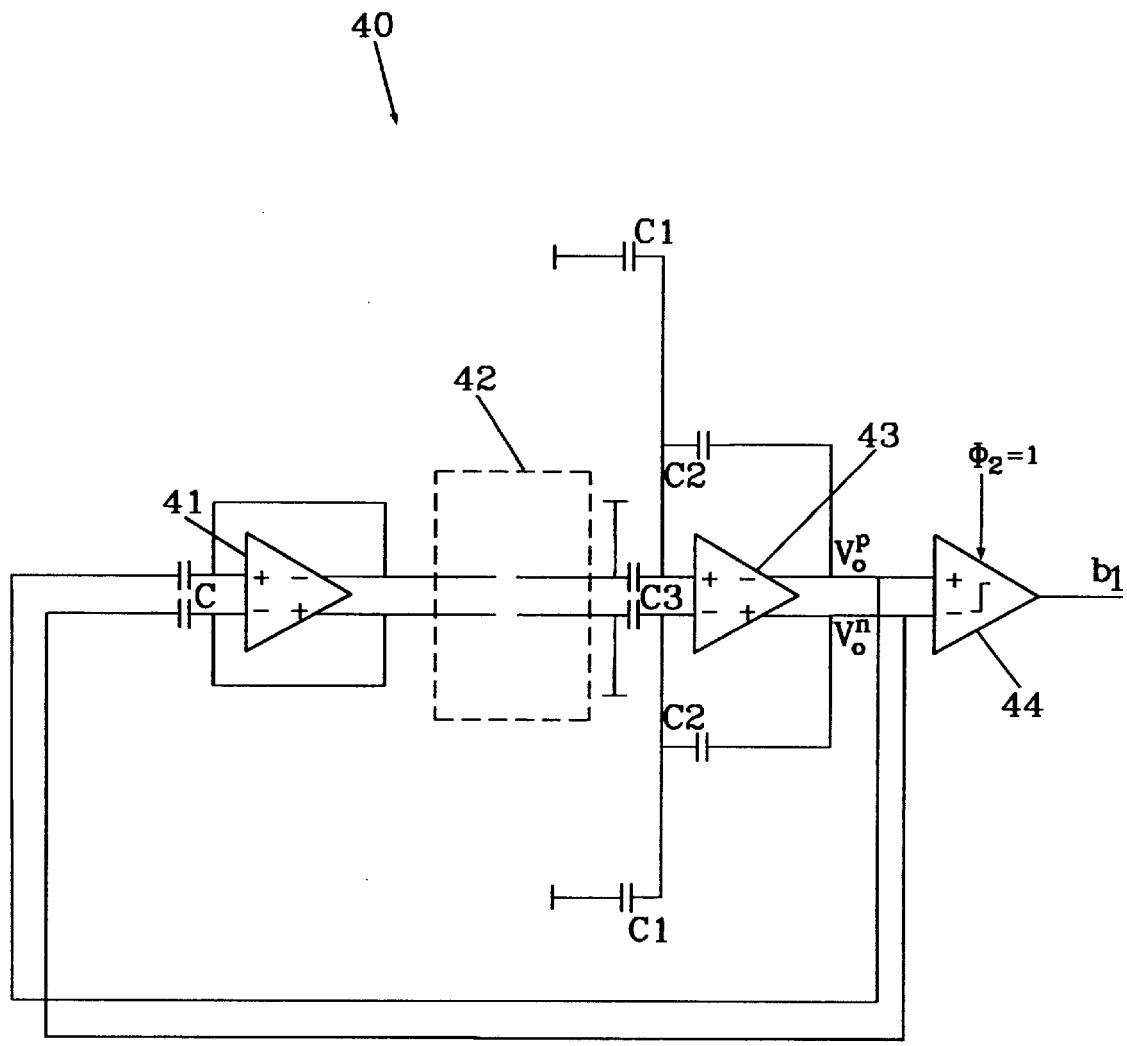

FIG. 7B illustrates the cyclic A/D-converter 40 during the second clock phase $\Phi_2$ for the MSB. According to table II, the switches $S_2$, $S_5$, $S_6$, $S_8$ and $S_{10}$ are turned on. The input capacitors C1 are connected to ground to force the charge thereover onto the associated parallel capacitors C2 of the second OPAMP 43. The voltage over the parallel capacitors C2 constitute the output of the second OPAMP 43:

$$V_o^p(1) = V_{in}^p, \quad V_o^n(1) = V_{in}^n + \Delta V_e(0), \tag{5.2}$$

where $\Delta V_e(0)$ represents an error voltage in sampling and holding the input signal. For simplicity, $\Delta V_e(0)$ is referred to the negative side. It should be understood that $\Delta V_e(0)$ indicates the quality of the input to the cyclic conversion rather than the quality of the cyclic conversion itself. A non-zero $\Delta V_e(0)$ is equivalent to an input signal $V_{in}' = V_{in} + \Delta V_e(0)$ and an ideal sample and hold. For simplicity it is therefore assumed that $\Delta V_e(0)=0$ in the following.

The output of the second OPAMP 43 is passed to the comparator 44, and the first output bit $b_1$ of the comparator 44 is generated according to the following relations:

$$b_i = \begin{cases} 1, & \text{if } V_o^p(1) - V_o^n(1) \geq 0 \\ 0, & \text{if } V_o^p(1) - V_o^n(1) < 0 \end{cases} \tag{5.3}$$

The input to the comparator 44 is differential and the output is digital. Furthermore, the output of the second OPAMP 43 is sampled by the associated front capacitors C of the first OPAMP 41, acting as a unity gain buffer. The front capacitors C of the first OPAMP 41 act as a memory element in that it holds the output of the second OPAMP 43 until the next clock phase. The first OPAMP 41 itself is short-circuited.

Figure 7C:
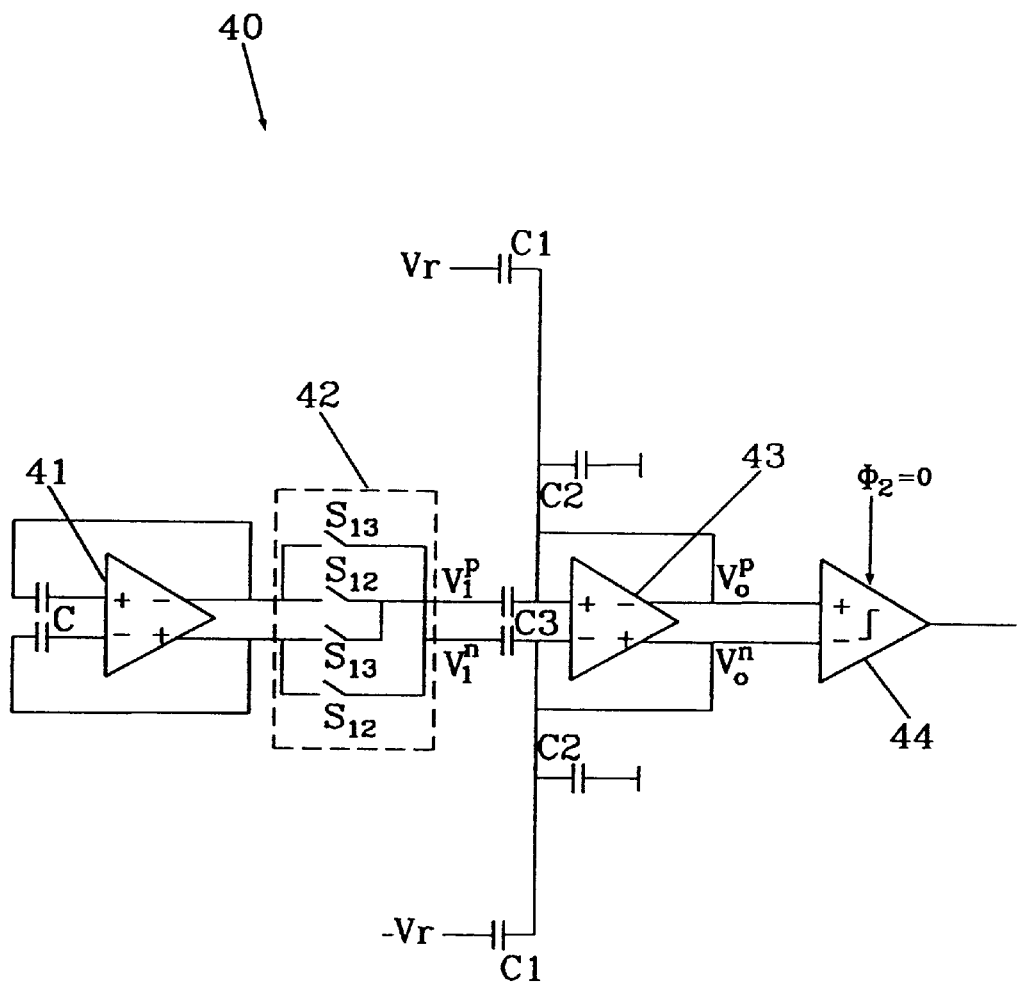

FIG. 7C illustrates the cyclic A/D-converter 40 during the next clock phase, high $\Phi_1$ for the second MSB (i=2). According to table II, the switches $S_3$, $S_4$, $S_9$ and $S_{11}$ are turned on. The switches $S_{12}$ and the switches $S_{13}$ depend on the previously generated output bit $b_1$. If $b_1$ is equal to 0, the switches $S_{12}$ are turned on and the switches $S_{13}$ are turned off. If $b_1$ is equal to 1, the switches $S_{12}$ are turned off and the switches $S_{13}$ are turned on. The signal sampled by the associated front capacitors C of the first OPAMP 41, corresponding to the output signal of the second OPAMP 43 in the previous clock phase, is passed to the switch arrangement 42. The switch arrangement 42 selectively performs a signal inversion in dependence on the output bit $b_1$ generated in the previous clock phase. More specifically, the states of the switches $S_{12}$ and the switches $S_{13}$ determine whether or not the switch arrangement 42 interchanges the polarity of the differential signal. Accordingly, the output of the switch arrangement 42 will be given by:

$$V_1^p(1) = (-1)^{b_1} \cdot V_o^p(1) = (-1)^{b_i} \cdot V_{in}^p \quad (5.4)$$

$$V_1^n(1) = (-1)^{b_1} \cdot V_o^n(1) = (-1)^{b_i} \cdot V_{in}^n$$

The output of the switch arrangement 42 is transferred to the associated front capacitors C3 of the second OPAMP 43. In addition, the differential reference signal is sampled by the input capacitors C1. The second OPAMP 43 itself is short-circuited, and the capacitors C2 are connected to ground.

Figure 7D:
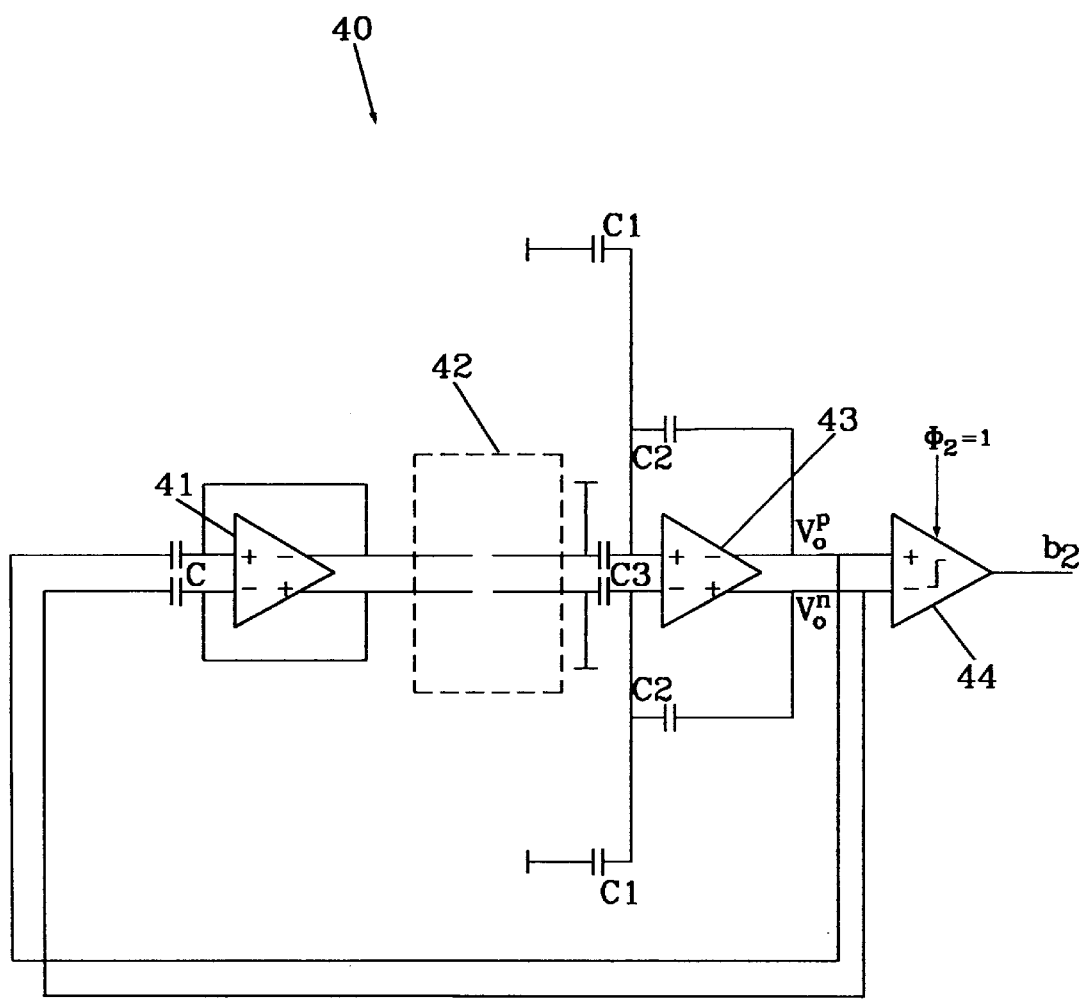

FIG. 7D illustrates the cyclic A/D-converter 40 at the high clock phase of $\Phi_2$ for the second MSB (i=2). According to table II, the switches $S_2$, $S_5$, $S_6$, $S_8$ and $S_{10}$ are turned on. The second OPAMP 43 is in the amplify phase and the selectively inverted signal sampled by the associated front capacitors C3 of the second OPAMP 43 is amplified by two. The input capacitors C1 are connected to ground to force the charge thereover onto the associated parallel capacitors C2 of the second OPAMP 43. This means that the voltage of the reference signal will contribute to the output of the second OPAMP 43. Thus, the output of the second OPAMP 43 will be:

$$V_o^p(2) = 2 \cdot V_1^p(1) + V_r = 2 \cdot (-1)^{b_1} \cdot V_{in}^p + V_r \quad (5.5)$$

$$V_o^n(2) = 2 \cdot V_1^n(1) - V_r + \Delta V_e(1) = 2 \cdot (-1)^{b_1} \cdot V_{in}^n - V_r + \Delta V_e(1)$$

where $\Delta V_e(1)$ represents the error voltage in generating the second output bit $b_2$. It represents all errors introduced to the signal when performing a complete bit-conversion cycle, starting at $V_o^p(1)$ and ending at $V_o^p(2)$. This error voltage is representative of a number of different types of errors. Switches provided at high impedance nodes normally inject a small charge, a so called clock induced charge, which gives rise to a DC-offset error voltage. In a differential realization, these offset errors will ideally exclude each other. However, asymmetric switch pairs in regard to clock induced charge injection will generate a DC-offset. In general, there is a DC-offset inherent in each OPAMP. However, in accordance with the invention, these offsets are minimized by resetting the OPAMPs and storing the offsets in the associated capacitors of the OPAMPs in the previous clock phase. In the following, all errors together, including low-frequency noise as well, produced in generating the i-th output bit are represented by the error voltage $\Delta V_e(i-1)$. For simplicity it is assumed that $\Delta V_e(i-1)$ is introduced at the second OPAMP 43 on the negative side of the differential realization. The comparator 44 generates the second output bit $b_2$ according to $$b_2 = \begin{cases} 1, & \text{if } V_o^p(2) - V_o^n(2) \geq 0 \\ 0, & \text{if } V_o^p(2) - V_o^n(2) < 0 \end{cases} \quad (5.6)$$

In addition, the output of the second OPAMP 43 is sampled by the associated front capacitors of the first OPAMP 41.

The operation of the cyclic A/D-converter continues, alternating between the circuit configuration of FIG. 7C and the circuit configuration of FIG. 7D, until all output bits have been generated.

The following relationships hold true in generating the i-th MSB, bi. In the first clock phase $\Phi_1$ for the i-th MSB, the output of the second OPAMP 43 sampled by the front capacitors C of the first OPAMP 41 is selectively inverted in dependence on the previously generated output bit $b_{i-1}$:

$$V_1^p(i) = (-1)^{b_{i-1}} \cdot V_o^p(i-1) \quad (5.7)$$

$$V_1^n(i) = (-1)^{b_{i-1}} \cdot V_o^n(i-1)$$

In the second clock phase $\Phi_2$ for the i-th MSB, the amplification by 2, the adding of the reference signal, and the generation of the i-th MSB are realized:

$$V_o^p(i) = 2 \cdot V_1^p(i) + V_r = \quad (5.8)$$

$$2^{i-1} \cdot (-1)^{\sum_{j=1}^{i-1} b_j} \cdot V_{in}^p + \left\{ \sum_{j=1}^{i-2} \left( 2^{i-1-j} \cdot (-1)^{\sum_{k=j+1}^{i-1} b_k} \right) + 1 \right\} \cdot V_r$$

$$V_o^n(i) = 2 \cdot V_1^n(i) - V_r + \Delta V_e(i-1) =$$

$$2^{i-1} \cdot (-1)^{\sum_{j=1}^{i-1} b_j} \cdot V_{in}^n - \left\{ \sum_{j=1}^{i-2} \left( 2^{i-1-j} \cdot (-1)^{\sum_{k=j+1}^{i-1} b_k} \right) + 1 \right\} \cdot V_r +$$

$$\sum_{j=1}^{i-2} \left( 2^{i-1-j} \cdot (-1)^{\sum_{k=j+1}^{i-1} b_k} \cdot \Delta V_e(j) \right) + \Delta V_e(i-1)$$

where $\Delta V_e(j)$ represents the error voltage in generating the (j+1)-th output bit. The i-th MSB is generated according to $$b_i = \begin{cases} 1, & \text{if } V_o^p(i) - V_o^n(i) \geq 0 \\ 0, & \text{if } V_o^p(i) - V_o^n(i) < 0 \end{cases} \quad (5.9)$$

To generate a total of n output bits, n clock periods are required. The last output bit, the LSB, is generated according to $$b_n = \begin{cases} 1, & \text{if } V_o^p(n) - V_o^n(n) \geq 0 \\ 0, & \text{if } V_o^p(n) - V_o^n(n) < 0 \end{cases} \quad (5.10)$$

where $$V_o^p(n) = 2 \cdot V_1^p(n) + V_r = \quad (5.11)$$

$$2^{n-1} \cdot (-1)^{\sum_{j=1}^{n-1} b_j} \cdot V_{in}^p + \left\{ \sum_{j=1}^{n-2} \left( 2^{n-1-j} \cdot (-1)^{\sum_{k=j+1}^{n-1} b_k} \right) + 1 \right\} \cdot V_r$$

$$V_o^n(n) = 2 \cdot V_1^n(n) - V_r + \Delta V_e(n-1) =$$

-continued $$2^{n-1} \cdot (-1)^{\sum_{j=1}^{n-1} b_j} \cdot V_{in}^n - \left\{ \sum_{j=1}^{n-2} \left( 2^{n-1-j} \cdot (-1)^{\sum_{k=j+1}^{n-1} b_k} \right) + 1 \right\} \cdot V_r +$$

$$\sum_{j=1}^{n-2} \left( 2^{n-1-j} \cdot (-1)^{\sum_{k=j+1}^{n-1} b_k} \cdot \Delta V_e(j) \right) + \Delta V_e(n-1)$$

The last term of $V_o{}^n(n)$ represents the total accumulated error generated in an n-bit cyclic A/D-conversion according to the invention:

$$\varepsilon_{Gray} = \sum_{j=1}^{n-2} \left( 2^{n-1-j} \cdot (-1)^{\sum_{k=j+1}^{n-1} b_k} \cdot \Delta V_e(j) \right) + \Delta V_e(n-1) \quad (5.12)$$

The expression (5.12) is in correspondence with expression (2.5) given above.

It is possible to modify the fully differential circuit realization described above in connection with FIGS. 5, 6 and 7A–D by changing the specific configuration of switches and capacitors. The number of switches and capacitors may be altered. There are alternative ways of injecting the differential input signal and the differential reference signal into the circuit. By way of example, individual switched-capacitor units may be used for each of the input signal and the reference signal. The sample-and-hold functionalities as well as the inversion are also possible to realize in alternative forms. The clock signals that control the switches and circuits of the cyclic A/D-converter will of course be adjusted in accordance with these modifications of the circuit realization.

It should also be understood that single-ended A/D-converter realizations based on the fully differential realization described above are easily obtained.

Simulations

The operation of a conventional binary code cyclic A/D-converter and the Gray code cyclic A/D-converter proposed according to the invention have been simulated in an algorithm simulator. Both static and dynamic performances have been studied.

Figure 8:
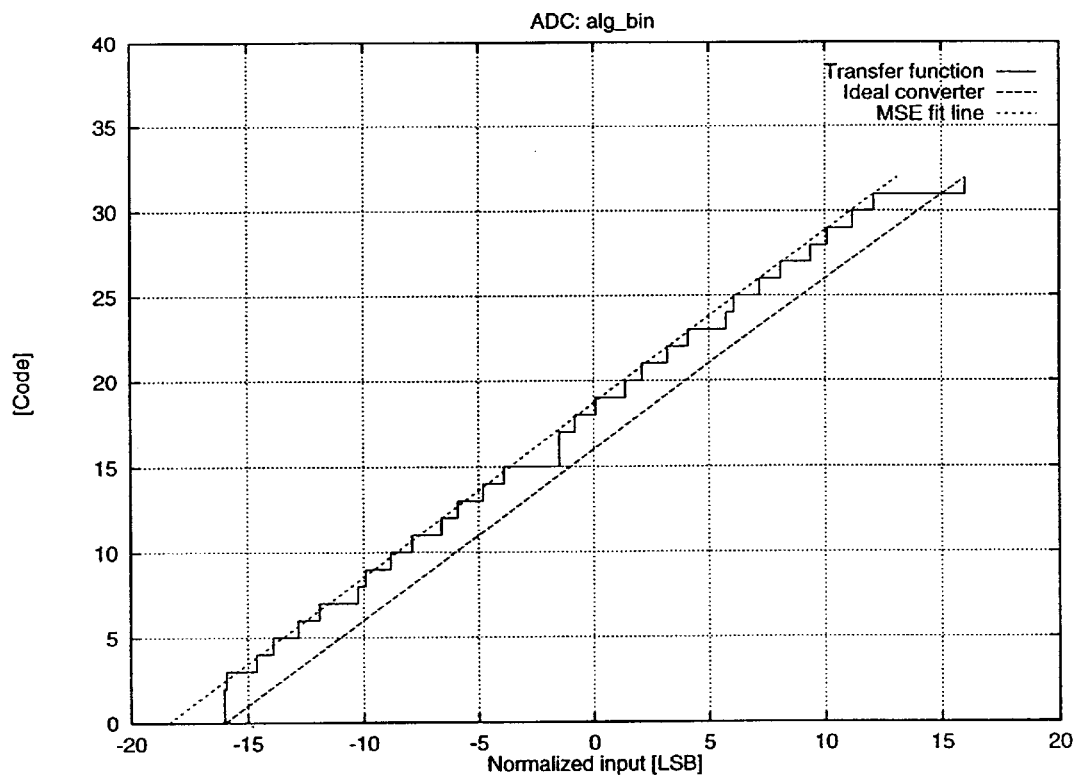
FIG. 8 illustrates a transfer curve of a 5-bit cyclic A/D-converter based on binary coding.
Figure 9:
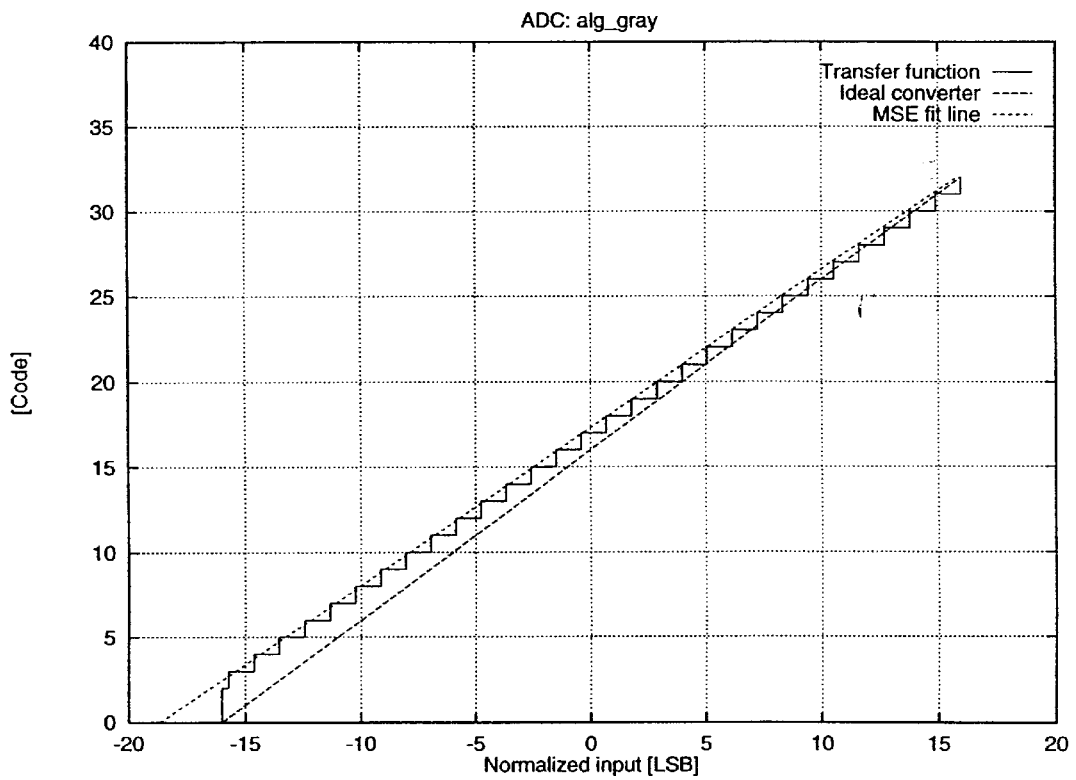
FIG. 9 illustrates a transfer curve of a 5-bit cyclic A/D-converter based on the Gray coding algorithm according to the invention.

Regarding the static behavior, the introduction of offset errors has been simulated and the effects will be briefly described with reference to FIGS. 8 and 9. In FIG. 8 there is illustrated a transfer curve of a 5-bit cyclic A/D-converter based on binary coding. FIG. 9 illustrates a transfer curve of a 5-bit cyclic A/D-converter based on the Gray coding algorithm according to the invention. In both converter types, the magnitude of introduced offset errors is assumed to be 1.5 LSB.

It is seen from FIG. 8 that the simulated offset errors gives the transfer curve for the binary code A/D-converter apparent non-linear characteristics. The transfer curve departs from the ideal stepped transfer curve, and missing codes, such as code 16, are introduced in the binary code cyclic A/D-converter.

In the transfer curve of FIG. 9 for the Gray code cyclic A/D-converter according to the invention, the only noticeable effect of the simulated offset errors is the introduction of a small gain error. The slope or gain of the transfer curve has changed, but otherwise the ideal stepped form of the curve remains unchanged.

In addition, the proposed Gray code architecture of cyclic A/D-converters also turns out to improve the operation performance in comparison to conventional binary code cyclic A/D-converters in several other ways. The integral non-linearity and the differential non-linearity of the inventive Gray code A/D-converter are much smaller than their binary code counterparts. The signal-to-noise-and-distortion ratio (SNDR) and the spurious-free dynamic range (SFDR) are improved significantly by the proposed Gray code conversion.

In summary, both theoretical derivations and system simulations have shown that the proposed Gray code cyclic A/D-converter is superior to conventional cyclic A/D-converters. The new and inventive cyclic A/D-converter architecture based on the Gray coding algorithm according to the invention is well suited for high-accuracy as well as for low-distortion applications.

In accordance with a second aspect of the invention, the inverse of the principles utilized for cyclic A/D-conversion is used for cyclic D/A-conversion. Accordingly, the second aspect of the invention relates to the conversion of digital input signals into analog output signals. In a cyclic D/A-converter the bits are applied to the same circuit which cyclically generates the analog output signal. In accordance with a preferred embodiment of the second aspect of the invention, a Gray coded digital signal is converted into an analog output signals according to a recursive algorithm defined by the following equation:

$$V_g(i) = \tfrac{1}{2} [V_g(i+1) - V_r] \cdot (-1)^{b_g(i)}, i=N, N-1, \ldots, 1 \quad (6.1)$$

where $b_g(1)$ designates the MSB and $b_g(N)$ designates the LSB, assuming an N-bit D/A-converter. The subscript g indicates that the digital input is Gray code. $V_g(i)$ represents the intermediate quantity associated with the i-th LSB, where $2 \leq i \leq N$, and $V_g(N+1)=0$. The output quantity of the D/A-converter is $V_{gout}$ which is equal to $V_g(1)$. $V_r$ denotes a predetermined reference quantity. The D/A-conversion starts from the LSB. The intermediate quantities, the reference quantity and the output quantity can be charges, voltages or currents depending on the particular circuit realization.

By iterating equation (6.1) above, the result will be:

$$V_{gout} = V_g(1) = -\left\{ \sum_{i=1}^{N} \frac{1}{2^i} (-1)^{\sum_{j=1}^{i} b_g(j)} \right\} \cdot V_r \quad (6.2)$$

Suppose there is an offset error $\Delta V_g(i)$ in generating each of the intermediate quantities and the output quantity. Referring to equation (6.1) above with consideration to the error $\Delta V_g(i)$, the following equation results:

$$V_g(i) = \frac{1}{2} \cdot [V_g(i+1) - V_r + \Delta V_g(i)] \cdot (-1)^{b_g(i)} \quad (6.3)$$

By iterating equation (6.3) until i=1, the result will be:

$$V_{gout} = V_g(1) = -\left\{ \sum_{i=1}^{N} \frac{1}{2^i} (-1)^{\sum_{j=1}^{i} b_g(j)} \right\} \cdot V_r + \left\{ \sum_{i=1}^{N} \frac{1}{2^i} (-1)^{\sum_{j=1}^{i} b_g(j)} \cdot \Delta V_g(i) \right\} \quad (6.4)$$

Therefore, the total accumulated error in a complete D/A-conversion according to the invention is determined by:

$$\Delta V_{gout} = \left\{ \sum_{i=1}^{N} \frac{1}{2^i} (-1)^{\sum_{j=1}^{i} b_g(j)} \cdot \Delta V_g(i) \right\} \quad (6.5)$$

The total accumulated error in a D/A-conversion according to the invention is considerably lower than that in conventional D/A-conversions. In particular, in comparison to binary code cyclic D/A-conversion, a corresponding improvement as that between cyclic A/D-conversion according to the invention and conventional binary code cyclic A/D-conversion is obtained.

Figure 10:
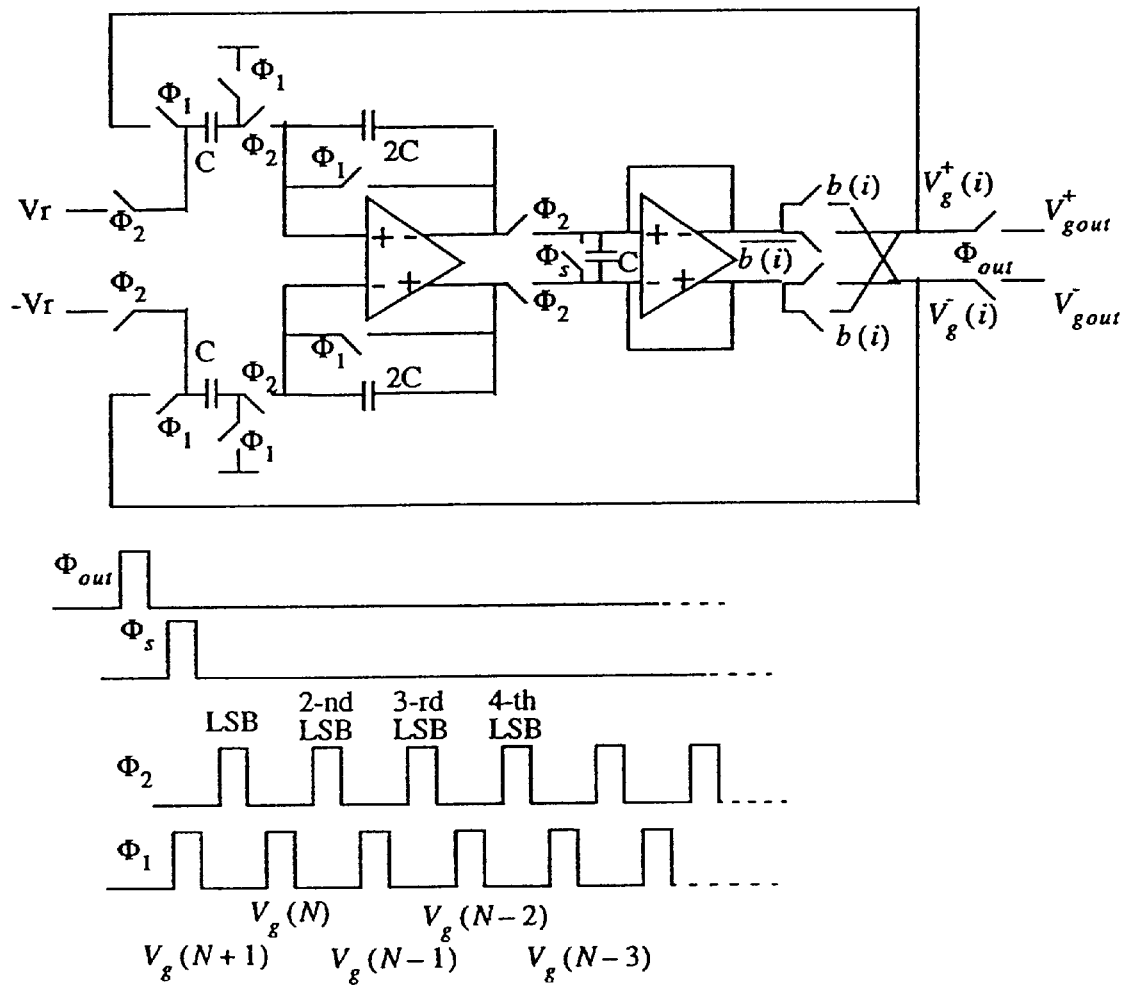
FIG. 10 is a circuit diagram of a fully differential realization of a cyclic D/A-converter in accordance with the invention.

FIG. 10 is a circuit diagram of a fully differential realization of a cyclic D/A-converter in accordance with the invention. The circuit implementation of FIG. 10 realizes the recursive algorithm given by equation (6.1). Just as the fully differential A/D-converter realization of FIG. 5, the realization of FIG. 10 is of switched-capacitor type with digitally controlled switches. Since a D/A-conversion is the inverse of an A/D-conversion, reference is made to the description in connection with the A/D-converter of FIG. 5, 6 and 7A–D for a more detailed understanding of the D/A-converter of FIG. 10. However, in a D/A-conversion according to the invention, a subtraction of the reference and an amplification by a factor of 0.5 are performed. It should also be understood that the Gray code bits of the digital signal determines whether or not the inverse function is realized.

The embodiments described above are merely given as examples, and it should be understood that the invention is not limited thereto. It is of course possible to embody the invention in specific forms other than those described without departing from the spirit of the invention. Further modifications and improvements which retain the basic underlying principles disclosed and claimed herein are within the scope and spirit of the invention.

What is claimed is:

1. A method for cyclic A/D-conversion of an analog input signal $V_{in}$ into a digital output value of a predetermined number, n, of output bits $b_i$, where i is an integer from 1 to n, said method comprising the steps of:

comparing the input signal $V_{in}$, being defined as a first cyclic signal $V_o(1)$, with a predetermined level to generate the first output bit $b_i$; and generating the subsequent output bits $b_i$, where i ranges from 2 to n, by executing the following steps for each subsequent output bit $b_i$:

generating a next cyclic signal $V_o$ by:

subjecting the previous cyclic signal $V_o(i-1)$ to a sample and hold operation, to an amplification by two, and selectively, depending on the previously generated output bit, to a signal inversion; and adding a predetermined reference signal to said amplified and selectively inverted signal; and comparing said next cyclic signal $V_o(i)$ with said predetermined level to generate said subsequent output bit bi of the digital output value.

2. The method according to claim 1, further comprising the step of digitally converting said digital output value into an output value of a regular binary code.

3. A cyclic A/D-converter for converting an analog input signal into a digital output signal by using a predetermined reference signal, comprising:

an amplifier having a gain factor of 2;

means for selectively adding the input signal in parallel over said amplifier;

means for selectively adding the predetermined reference signal in parallel over said amplifier;

a comparator for generating an output bit of the digital output signal in response to the output signal of said amplifier;

a sample-and-hold circuit for recurrently sampling and holding the output signal of said amplifier;

means for selectively inverting said sampled and held signal in dependence on the previously generated output bit of said comparator, wherein said amplifier is responsive to said selectively inverted signal; and a clock signal generator for generating a set of clock signals that control said means for adding the input signal, said means for adding the reference signal, said sample-and-hold circuit, said means for selectively inverting, and said comparator.

4. A cyclic A/D-converter according to claim 3, further comprising means for resetting said amplifier and said sample and-hold circuit.

5. A cyclic A/D-converter for converting an analog input signal $V_{in}$, into a digital output signal of a predetermined number, n, of output bits $b_i$ by using a predetermined reference signal, where i is an integer from 1 to n, said cyclic A/D-converter comprising:

means for comparing the input signal $V_{in}$, being defined as a first cyclic signal $V_o(1)$, with a predetermined level to generate the first output bit $b_i$;

means for cyclically generating each one of the subsequent output bits b, where i ranges from 2 to n, including:

means for generating a next cyclic signal $V_o(i)$ including:

means for subjecting the previous cyclic signal $V_o(i-1)$ to a sample and hold operation, to an amplification by two, and selectively, depending on the previously generated output bit, to a signal inversion; and means for adding the predetermined reference signal to said amplified and selectively inverted signal; and means for comparing said next cyclic signal $V_o(i)$ with said predetermined level to generate said subsequent output bit $b_i$ of the digital output signal.

6. A cyclic analog-to-digital (A/D) converter for converting a differential analog input signal into a digital output signal by using a predetermined differential reference signal, comprising:

first switch-capacitor units selectively responsive to the differential input signal and selectively responsive to the differential reference signal, for being charged in response thereto;

an amplifying circuit with a gain factor of 2 having a primary operational amplifier with two input terminals and two output terminals, associated front capacitors, each one connected in front of a respective one of said input terminals, and associated parallel capacitors, each one selectively connected in parallel over a respective pair of said input-output terminals, each one of said parallel capacitors being connected to a respective one of said first switch-capacitor units such that a first switch-capacitor unit, when being discharged, contributes to the charge over said parallel capacitor;

a comparator, having two input terminals being connected to said output terminals of said amplifying circuit, for generating an output bit of the digital output signal in response to the differential output signal of said amplifying circuit;

feedback switches connected to said output terminals of said amplifying circuit;

a sample-and-hold circuit having a secondary operational amplifier with two input terminals and two output terminals, and associated capacitors each of which is connected to a respective one of said input terminals of said secondary operational amplifier, said associated capacitors being connected to said feedback switches such that said sample-and-hold circuit samples and holds the differential output signal from said amplifying circuit when said feedback switches are closed;

a switch arrangement having input terminals and output terminals, the input terminals of said switch arrangement being connected to the output terminals of said sample-and-hold circuit for selectively, depending on said output bit, interchanging the differential output signal of said sample-and-hold circuit, the output terminals of said switch arrangement being connected to the associated front capacitors of said amplifying circuit;

means for selectively resetting said amplifying circuit, said sample-and-hold circuit, and said first switch-capacitor units; and means for generating a first set of clock signals of predetermined timing and signal values, and for generating a second set of clock signals with signal values that depend on the generated output bits, wherein said first switch-capacitor units, said means for selectively resetting, said feedback switches and said comparator are controlled by said first set of clock signals, and said switch arrangement is controlled by said second set of clock signals.

* * * * *